United States Patent
Dally et al.

(10) Patent No.: US 9,171,607 B2
(45) Date of Patent: *Oct. 27, 2015

(54) GROUND-REFERENCED SINGLE-ENDED SYSTEM-ON-PACKAGE

(71) Applicant: NVIDIA Corporation, Santa Clara, CA (US)

(72) Inventors: William J. Dally, Los Altos Hills, CA (US); John W. Poulton, Chapel Hill, NC (US); Thomas Hastings Greer, III, Chapel Hill, NC (US); Brucek Kurdo Khailany, Austin, TX (US); Carl Thomas Gray, Apex, NC (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/938,161

(22) Filed: Jul. 9, 2013

(65) Prior Publication Data

US 2014/0269012 A1    Sep. 18, 2014

Related U.S. Application Data

(63) Continuation-in-part of application No. 13/844,570, filed on Mar. 15, 2013.

(51) Int. Cl.
*G11C 11/40* (2006.01)
*G11C 11/4096* (2006.01)
(Continued)

(52) U.S. Cl.
CPC .......... *G11C 11/4096* (2013.01); *G11C 7/1057* (2013.01); *G11C 7/1069* (2013.01); *H04L 25/0276* (2013.01)

(58) Field of Classification Search
CPC ....................................................... G11C 11/40

USPC ..................................................... 365/189.18
See application file for complete search history.

(56) References Cited

U.S. PATENT DOCUMENTS 6,125,047 A    9/2000   Janz
7,436,680 B2   10/2008  Wang
(Continued)

FOREIGN PATENT DOCUMENTS

CN    1324514 A    11/2001
CN    1647381 A    7/2005
(Continued)

OTHER PUBLICATIONS

Notice of Allowance from U.S. Appl. No. 14/055,823, dated Feb. 23, 2015.
(Continued)

*Primary Examiner* — Amir Zarabian
*Assistant Examiner* — Min Huang
(74) *Attorney, Agent, or Firm* — Zilka-Kotab, PC

(57) ABSTRACT

A system of interconnected chips comprising a multi-chip module (MCM) includes a first processor chip, a system function chip, and an MCM package configured to include the first processor chip and the system function chip. The first processor chip is configured to include a first ground-referenced single-ended signaling (GRS) interface circuit. The system function chip is configured to include a second GRS interface circuit. A first set of electrical traces are fabricated within the MCM package and coupled to the first GRS interface circuit and to the second GRS interface circuit. The first GRS interface circuit and second GRS interface circuit together provide a communication channel between the first processor chip and the system function chip.

22 Claims, 15 Drawing Sheets

(51) Int. Cl.
G11C 7/10 (2006.01)
H04L 25/02 (2006.01)

(56) References Cited

U.S. PATENT DOCUMENTS

| | | | |
|---|---|---|---|
| 7,786,601 | B2 | 8/2010 | Kim |
| 7,962,115 | B2 | 6/2011 | Huang et al. |
| 8,102,157 | B2 | 1/2012 | Abe |
| 8,395,410 | B2 | 3/2013 | Hatori |
| 8,395,416 | B2 | 3/2013 | Harriman et al. |
| 8,538,558 | B1 * | 9/2013 | Sabapathy et al. ............... 700/4 |
| 8,583,953 | B2 | 11/2013 | Sultenfuss |
| 8,611,437 | B2 | 12/2013 | Poulton et al. |
| 8,621,131 | B2 | 12/2013 | Loh et al. |
| 8,710,920 | B2 | 4/2014 | Huang |
| 8,854,123 | B1 | 10/2014 | Dally et al. |
| 2002/0104035 | A1 * | 8/2002 | Burns et al. ............... 713/500 |
| 2003/0185067 | A1 * | 10/2003 | Dellow ............... 365/200 |
| 2003/0208668 | A1 * | 11/2003 | To et al. ............... 711/200 |
| 2004/0114650 | A1 | 6/2004 | Tanaka et al. |
| 2005/0207234 | A1 | 9/2005 | Baechtold et al. |
| 2006/0232311 | A1 | 10/2006 | Kitayama |
| 2007/0035037 | A1 | 2/2007 | Kim |
| 2007/0159488 | A1 | 7/2007 | Danskin et al. |
| 2007/0160319 | A1 | 7/2007 | Wang |
| 2007/0210835 | A1 | 9/2007 | Aghtar |
| 2007/0211711 | A1 * | 9/2007 | Clayton ............... 370/360 |
| 2008/0189457 | A1 * | 8/2008 | Dreps et al. ............... 710/106 |
| 2008/0212347 | A1 | 9/2008 | Mok et al. |
| 2008/0311702 | A1 * | 12/2008 | Wark ............... 438/109 |
| 2009/0002066 | A1 * | 1/2009 | Lee et al. ............... 327/554 |
| 2009/0031078 | A1 | 1/2009 | Warnes et al. |
| 2009/0189681 | A1 | 7/2009 | Ivanov et al. |
| 2010/0046266 | A1 | 2/2010 | Bruennert et al. |
| 2010/0202202 | A1 | 8/2010 | Roohparvar |
| 2010/0220541 | A1 | 9/2010 | Gebara et al. |
| 2011/0128071 | A1 | 6/2011 | Fukusen et al. |
| 2011/0199122 | A1 | 8/2011 | Morishita et al. |
| 2011/0233741 | A1 | 9/2011 | Ishii et al. |
| 2011/0309475 | A1 | 12/2011 | Lee |
| 2012/0036379 | A1 | 2/2012 | Sultenfuss |
| 2012/0068735 | A1 | 3/2012 | Harriman et al. |
| 2012/0102260 | A1 | 4/2012 | Kawamura et al. |
| 2012/0163071 | A1 * | 6/2012 | Kurokawa ............... 365/174 |
| 2013/0166519 | A1 | 6/2013 | Matsuse |
| 2013/0188422 | A1 | 7/2013 | Kim et al. |
| 2013/0194031 | A1 | 8/2013 | Poulton et al. |
| 2013/0195165 | A1 | 8/2013 | Poulton et al. |
| 2013/0328597 | A1 | 12/2013 | Cassia |
| 2014/0036596 | A1 | 2/2014 | Chan et al. |
| 2014/0044159 | A1 | 2/2014 | Poulton et al. |
| 2014/0091834 | A1 | 4/2014 | Chi |
| 2014/0266416 | A1 | 9/2014 | Dally et al. |
| 2014/0266417 | A1 | 9/2014 | Dally et al. |
| 2014/0268976 | A1 | 9/2014 | Dally et al. |
| 2014/0269010 | A1 | 9/2014 | Dally |
| 2014/0269011 | A1 | 9/2014 | Dally et al. |
| 2014/0281383 | A1 | 9/2014 | Dally et al. |

FOREIGN PATENT DOCUMENTS

| | | |
|---|---|---|
| TW | 200727499 | 7/2007 |
| TW | I318444 B | 12/2009 |
| TW | 201229767 A | 7/2012 |

OTHER PUBLICATIONS

Non-Final Office Action from U.S. Appl. No. 14/055,823, dated Sep. 10, 2014.
Office Action from Chinese Patent Application No. 201210457686.8, dated Jul. 23, 2014.
Office Action from Taiwan Patent Application No. 101136888, dated Mar. 5, 2015.
Final Office Action from U.S. Appl. No. 13/361,843, dated Oct. 18, 2013.
Non-Final Office Action from U.S. Appl. No. 13/361,843, dated Jan. 5, 2015.
Non-Final Office Action from U.S. Appl. No. 13/361,843, dated Mar. 27, 2013.
Non-Final Office Action from U.S. Appl. No. 13/361,843, dated Aug. 13, 2013.
Office Action from Chinese Patent Application No. 201210459107.3, dated Apr. 16, 2015.
Notice of Allowance from U.S. Appl. No. 13/844,570, dated Mar. 19, 2015.
Non-Final Office Action from U.S. Appl. No. 13/844,570, dated Oct. 3, 2014.
Non-Final Office Action from U.S. Appl. No. 13/890,899, dated Dec. 4, 2014.
Non-Final Office Action from U.S. Appl. No. 13/973,947, dated Feb. 4, 2015.
Notice of Allowance from U.S. Appl. No. 13/946,980, dated Jun. 9, 2014.
Notice of Allowance from U.S. Appl. No. 13/933,058, dated Feb. 23, 2015.
Notice of Allowance from U.S. Appl. No. 13/933,058, dated Oct. 15, 2014.
Non-Final Office Action from U.S. Appl. No. 13/933,058, dated Jun. 27, 2014.
Non-Final Office Action from U.S. Appl. No. 13/973,952, dated Jan. 22, 2015.
Poulton, J. W. et al., "A 0.54pJ/b 20Gb/s Ground-Referenced Single-Ended Short-Haul Serial Link in 28nm CMOS for Advanced Packaging Applications," 2013 IEEE International Solid-State Circuits Conference, Feb. 17-21, 2013, pp. 404-405.
Notice of Allowance form U.S. Appl. No. 13/359,433, dated Sep. 19, 2013.
Non-Final Office Action from U.S. Appl. No. 13/359,433, dated Jul. 11, 2013.
Office Action from Taiwan Patent Application No. 101136887, dated May 4, 2015.
Office Action from Taiwan Application No. 102144846, dated Jul. 1, 2015.
Office Action from Taiwan Application No. 102145414, dated Jun. 25, 2015.

* cited by examiner

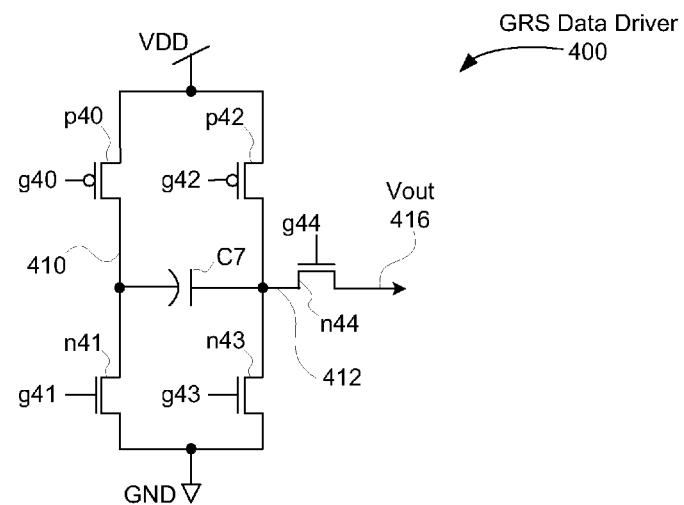
*Fig. 4A*
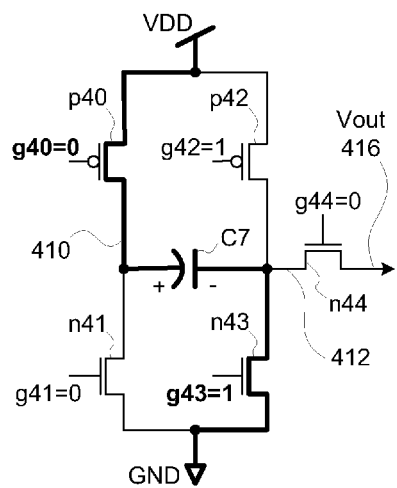 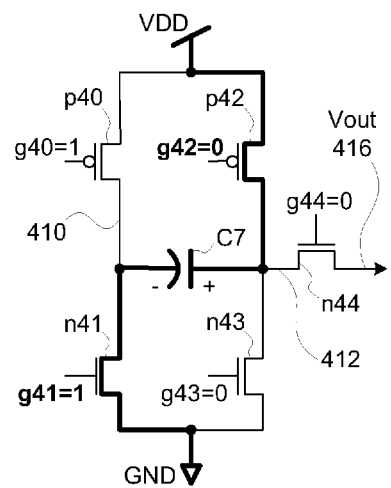
*Fig. 4B*  *Fig. 4C*

US 9,171,607 B2

GROUND-REFERENCED SINGLE-ENDED SYSTEM-ON-PACKAGE

CLAIM OF PRIORITY

This application is a continuation-in-part of U.S. application Ser. No. 13/844,570, filed Mar. 15, 2013, the entire contents of which is incorporated herein by reference.

This invention was made with Government support under Agreement No. HR0011-10-9-0008 awarded by DARPA, and under LLNS subcontract B599861 awarded by DOE. The Government has certain rights in the invention.

FIELD OF THE INVENTION

The present invention relates to digital signaling, and more specifically to a ground-referenced single-ended signaling system-on-package.

BACKGROUND

Sequential generations of computing systems typically require higher degrees of performance and feature integration. A typical computing system includes a central processing unit (CPU), a graphics processing unit (GPU), a high-capacity memory subsystem, and set of interface subsystems. The interface subsystems may include audio and video interfaces, signal processing blocks, a digital modem block, a wireless communications block, and the like. Conventional computing systems achieve higher degrees of performance and integration by implementing one or more CPU cores, one or more GPU cores, and a set of feature-specific subsystems, such as interface blocks, on a single die or chip. Such highly integrated chips are referred to in the art as a system-on-a-chip (SoC). Measures of die area for SoC devices have increased over time, as more CPU cores, GPU cores, on-chip cache memory, and additional interface blocks are integrated into a single SoC die. One advantage of integrating multiple processing cores and interface subsystems onto a single die is that high-performance may be achieved using conventional design techniques.

However, one disadvantage of integrating multiple processing cores and other subsystems onto a single SoC die is that die cost can increase disproportionately with respect to die area. More specifically, die area is typically a strong function of die area, which, in many cases, increases above a characteristic cost knee, leading to disproportionate cost inefficiencies associated with very large die. However, conventional chip-to-chip signaling techniques do not efficiently support multiprocessing performance targets commonly associated with high-performance SoC devices. As a consequence, only wide, on-chip interconnects are conventionally feasible options to achieve overall system performance targets.

One disadvantage of integrating certain feature-specific subsystems onto a given SoC device is that performance of a feature-specific subsystem may be compromised by a particular die fabrication process that may be optimized for other SoC subsystems, such as CPU and GPU processing cores. For example, a feature-specific subsystem implementing a digital radio modem comprising a mix of analog and digital circuit elements may require very different device characteristics for optimal performance than a CPU core comprising only digital circuit elements. In this example, selecting a die fabrication process optimized for the CPU core may lead to compromised performance of the digital radio modem.

Thus, there is a need for improving signaling and/or other issues associated with the prior art.

SUMMARY

A system of interconnected chips comprising a multi-chip module (MCM) is disclosed. The system includes a first processor chip, a system function chip, and an MCM package configured to include the first processor chip and the system function chip. The first processor chip is configured to include a first ground-referenced single-ended signaling (GRS) interface circuit. The system function chip is configured to include a second GRS interface circuit. A first set of electrical traces are fabricated within the MCM package and coupled to the first GRS interface circuit and to the second GRS interface circuit.

BRIEF DESCRIPTION OF THE DRAWINGS

FIG. 4A illustrates a ground-referenced single-ended data driver comprising a CMOS circuit, in accordance with one embodiment;

FIG. 4B illustrates a ground-referenced single-ended data driver in a pre-charge state associated with driving a data value of zero, in accordance with one embodiment;

FIG. 4C illustrates a ground-referenced single-ended data driver in a pre-charge state associated with driving a data value of one, in accordance with one embodiment;

DETAILED DESCRIPTION

Figure 1A:
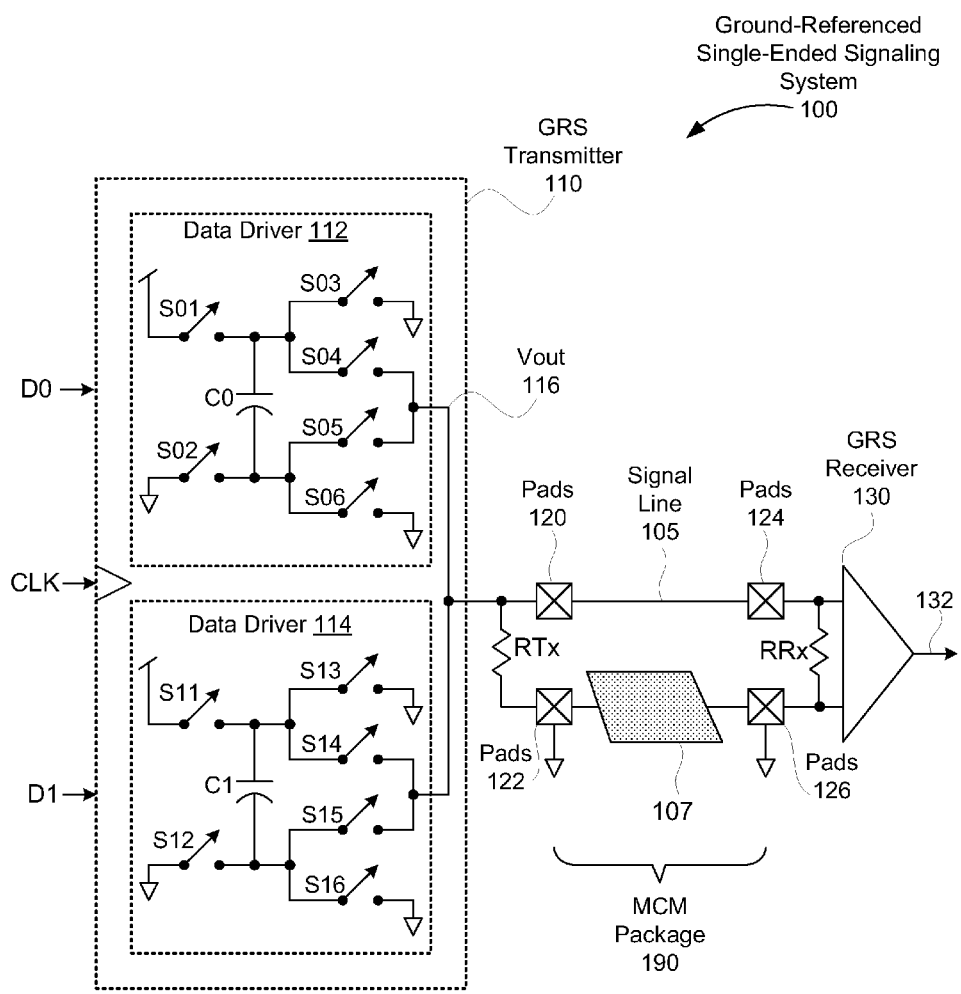
FIG. 1A illustrates a ground-referenced single-ended signaling (GRS) system that implements a GRS transmitter based on a flying capacitor charge pump, in accordance with one embodiment.

A technique is provided for high-speed, single-ended signaling between different chips comprising a system-on-package device. A ground-referenced driver transmits a pulse having a polarity determined by a corresponding logic state. The pulse traverses a signal path and is received by a ground-referenced amplifier, which amplifies the pulse for interpretation as a conventional logic signal. Sets of ground-referenced drivers and ground-referenced amplifiers implement high-speed interfaces configured to interconnect different chips comprising the system-on-package device. The high-speed communication enabled by ground-referenced signaling advantageously improves bandwidth between different chips within the system-on-package device, enabling higher performance and higher density systems than provided by conventional signaling techniques.

Embodiments of the present invention implement a system comprising a plurality of different processor chips, one or more memory chips, and feature-specific chips coupled to a multi-chip package. Interconnections between the different chips are routed through the multi-chip package. At least one of the interconnections is configured to implement a ground-referenced single-ended signaling (GRS) link, described below.

A GRS data driver implements a charge pump driver configured to transmit a ground-referenced pulse on an associated signal line. In one implementation, a pulse of positive charge indicates a logical one, while a pulse of negative charge indicates a logical zero. The charge pump driver eliminates simultaneous switching noise (SSN) commonly associated with single-ended signaling by forcing transient signal current and ground current to be locally balanced, and by drawing a constant amount of charge from the power supply each half clock cycle, independent of the data being transmitted. The pulse is received and amplified by a common gate amplifier stage configured to use a local ground signal as an input reference. This configuration provides substantial immunity to common mode noise, the dominant source of transmission errors in single-ended signaling. A second amplifier stage translates a given received pulse to full-swing logic voltages, allowing the received pulse to be properly interpreted as one or two logic states by conventional logic circuitry. In one embodiment, a GRS receiver comprises a common gate amplifier stage, the second amplifier stage, and two storage elements, such as flip-flips, configured to capture received data during alternate clock phases.

A GRS transceiver includes a GRS transmitter and a GRS receiver. The GRS transceiver transmits outbound data through the GRS transmitter and receives inbound data through the GRS receiver. An isochronous GRS transceiver may also transmit clocking information having a fixed phase relationship to the outbound data and receives clocking information having a fixed phase relationship to the inbound data. A GRS interconnect includes two different GRS transceivers, coupled through an electrical trace that is manufactured within a common multi-chip module package.

FIG. 1A illustrates a ground-referenced single-ended signaling (GRS) system 100 that implements a GRS transmitter 110 based on a flying capacitor charge pump, in accordance with one embodiment. GRS system 100 includes GRS transmitter 110, a transmission path comprising a signal line 105 and a ground network 107, and a GRS receiver 130. In one embodiment, GRS transmitter 110 comprises two data drivers 112, 114. Input data signals D0 and D1 are presented to GRS transmitter 110 based on a clock signal CLK. Data driver 112 is configured to capture a logic state associated with input D0 and drive output signal Vout 116 onto signal line 105 with a pulse corresponding to the logic state of input D0 while CLK is low. Similarly, data driver 114 is configured to capture a logic state associated with input D1 and drive output signal Vout 116 onto signal line 105 with a pulse corresponding to the logic state of D1 while CLK is high. A sequence of pulses is formed along signal line 105 corresponding to a sequence of input data from inputs D0 and D1. The sequence of pulses is referenced to ground with a voltage swing that may be lower than conventional logic voltage swings. GRS receiver 130 is configured to amplify an incoming sequence of pulses from signal line 105 and translate the pulses to a conventional logic voltage swing so the pulses may be properly interpreted as logic signals on amplifier output signal 132. For example, the sequence of pulses along signal line 105 may have a nominal amplitude of plus or minus one-hundred millivolts, while amplifier output signal 132 may have a corresponding voltage swing of twelve hundred millivolts to zero volts with respect to ground if logic coupled to amplifier output signal 132 operates on a twelve hundred millivolt positive supply rail.

In one embodiment, GRS transmitter 110 is fabricated on a transmitter chip and GRS receiver 130 is fabricated on a receiver chip distinct from the transmitter chip. Pads 120 comprise bonding pads configured to couple output signal Vout 116 from the transmitter chip to signal line 105, which is fabricated as an impedance-controlled trace within a multi-chip module (MCM) package 190. Pads 122 comprise bonding pads configured to couple a local ground signal within the transmitter chip to ground network 107, fabricated within MCM package 190. Similarly, pads 124 comprise bonding pads configured to couple signal line 105 to an input signal for GRS receiver 130 within the receiver chip, and pads 126 comprise bonding pads configured to couple ground network 107 to a local ground within the receiver chip. A termination resistor RTx is coupled between output signal Vout 116 and the local ground within the transmitter chip to absorb incoming signals, such as reflections or induced noise signals. A termination resistor RRx is coupled across inputs to GRS receiver 130 to similarly absorb incoming signals at the receiver chip.

Data driver 112 comprises capacitor C0, and switches SOT through S06. Switch S01 enables a first node of capacitor C0 to be coupled to a positive supply rail, while switch S02 enables a second node of capacitor C0 to be coupled to a local ground net. Switches S01 and S02 are active (closed) during a pre-charge state for data driver 112, defined when CLK is equal to a logical "1" value, Switch S03 enables the first node of capacitor C0 to be coupled to GND, while switch S06 enables the second node of capacitor C0 to be coupled to GND. Switch S04 enables the first node of capacitor C0 to be coupled to Vout 116, while switch S05 enables the second node of capacitor C0 to be coupled to Vout 116. When CLK is equal to a logical "0" value, switches S04 and S06 are active when data driver 112 is driving a logical "1" value to Vout 116, or switches S03 and S05 are active when data driver 112 is driving a logical "0" value to Vout 116. Data driver 114 comprises a substantially identical circuit topology, with an inverted sense for CLK, so that data driver 114 is in a pre-charge state when CLK is equal to a logical "0" value and driving Vout 116 when CLK is equal to a logical "1" value.

In one embodiment, switches S01 through S06 and switches S11 through S16 are fabricated using monolithic complementary metal-oxide semiconductor (CMOS) devices, such as enhancement mode n-channel and p-channel field-effect transistors. Any technically feasible logic circuit topologies may be implemented to drive switches S01-S06 and switches S11-S16 into individually active or inactive states without departing the scope and spirit of embodiments of the present invention.

Figure 1B:
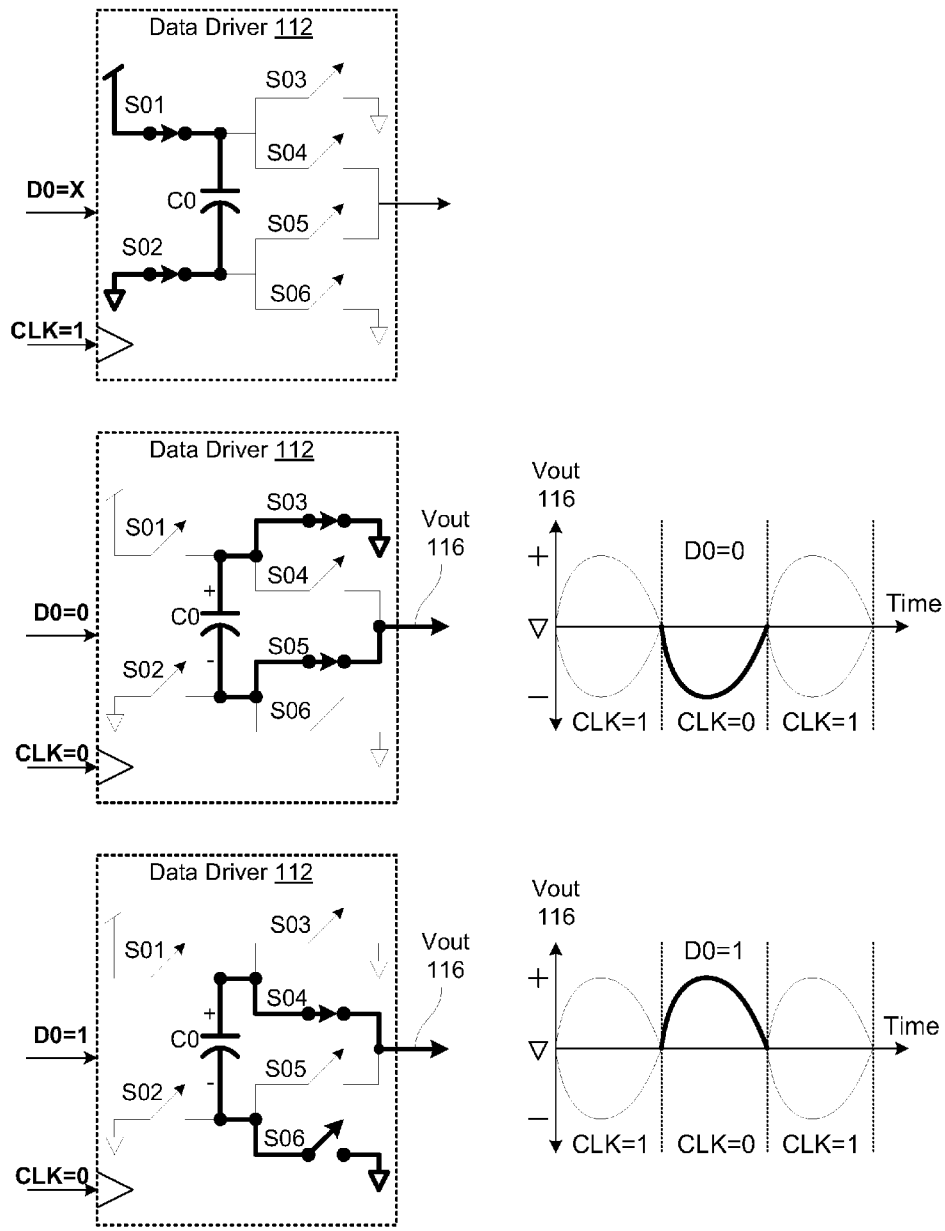
FIG. 1B illustrates operation of a data driver in a pre-charge state and in two different data-dependent drive states, in accordance with one embodiment.

FIG. 1B illustrates operation of a data driver 112 in a pre-charge state and in two different data-dependent drive states, in accordance with one embodiment. As shown, when CLK is equal to a logical "1" value, data driver 112 is in a pre-charge state, whereby switches S01 and S02 are active and capacitor C0 charges to a voltage corresponding approximately to a positive supply rail, such as a "VDD" supply rail. All of switches S03-S06 are inactive (open) during the pre-charge state. When CLK is equal to a logical "0" value, two of switches S03-S06 are configured to couple capacitor C0 to Vout 116 to transmit a pulse having a polarity corresponding to a logical value for D0. To drive a logical "0" value, switches S03 and S05 are driven active, thereby coupling a negative charge relative to ground onto Vout 116. To drive a logical "1" value, switches S04 and S06 are driven active, thereby coupling a positive charge relative to ground onto Vout 116.

Figure 1C:
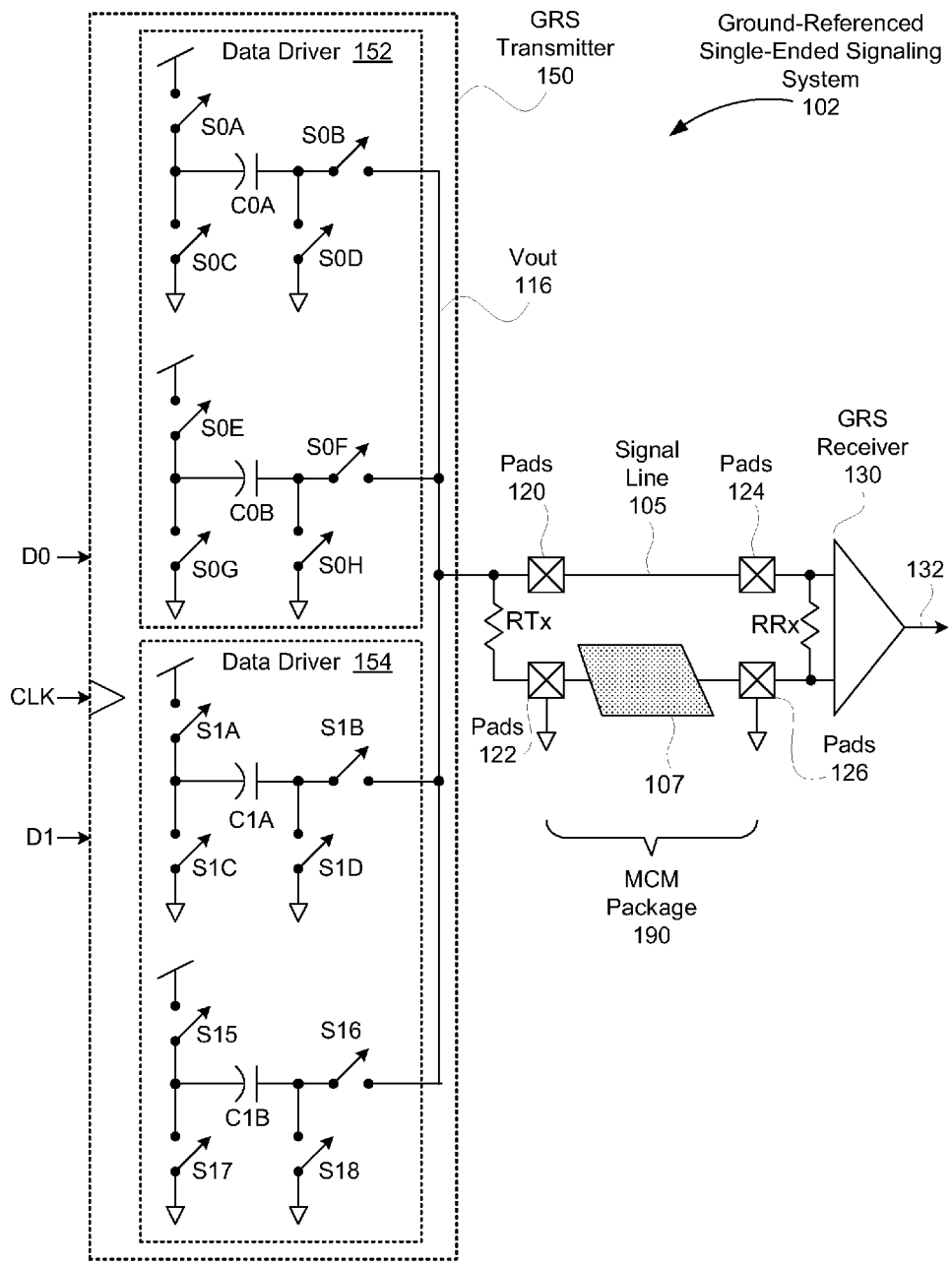
FIG. 1C illustrates a GRS system that implements a GRS transmitter based on a dual-capacitor charge pump, in accordance with one embodiment.

FIG. 1C illustrates a GRS system 102 that implements a GRS transmitter 150 based on a dual-capacitor charge pump, in accordance with one embodiment. GRS system 102 includes GRS transmitter 150, a transmission path comprising a signal line 105 and a ground network 107, and a GRS receiver 130. In one embodiment, GRS transmitter 150 comprises two data drivers 152 and 154. Operation of GRS system 102 is substantially identical to the operation of GRS system 100 described above in FIGS. 1A and 1B, with the exception of the internal topology and operation of data drivers 152 and 154.

Data driver 152 comprises capacitors C0A and C0B, as well as switches S0A through S0H. Switch S0A enables a first node of capacitor C0A to be coupled to a positive supply rail, while switch S0C enables the first node to be coupled to a local ground net. Switch S0B enables a second node of capacitor C0A to be coupled to Vout 116, while switch S0D enables the second node to be coupled to the local ground net. Similarly, switch S0E enables a first node of capacitor C0B to be coupled to the positive supply rail, while switch S0G enables the first node to be coupled to the local ground net. Switch S0F enables a second node of capacitor C0B to be coupled to Vout 116, while switch S0H enables the second node to be coupled to the local ground net.

A pre-charge state for data driver 152 is defined when CLK is equal to a logical "1" value. During the pre-charge state, switches S0A, S0D, S0G, and S0H are driven active, pre-charging capacitor C0A to a voltage corresponding to the positive supply rail relative to the local ground net, and pre-charging capacitor C0B to have approximately no charge. When CLK is equal to a logical "0" value, either capacitor C0A is coupled to Vout 116 to generate a negative pulse or capacitor C0B is coupled to Vout 116 to generate a positive pulse, as described below in conjunction with FIG. 1E. Data driver 154 comprises a substantially identical circuit topology, with an inverted sense for CLK, so that data driver 154 is in a pre-charge state when CLK is equal to a logical "0" value and driving Vout 116 when CLK is equal to a logical "1" value.

In one embodiment, switches S0A through S0H and switches S1A through S1H are fabricated using monolithic CMOS devices, such as enhancement mode n-channel and p-channel FEM. Any technically feasible logic circuit topologies may be implemented to drive switches S0A-S0H and switches S1A-S1H into individually active or inactive states without departing the scope and spirit of embodiments of the present invention.

Figure 1D:
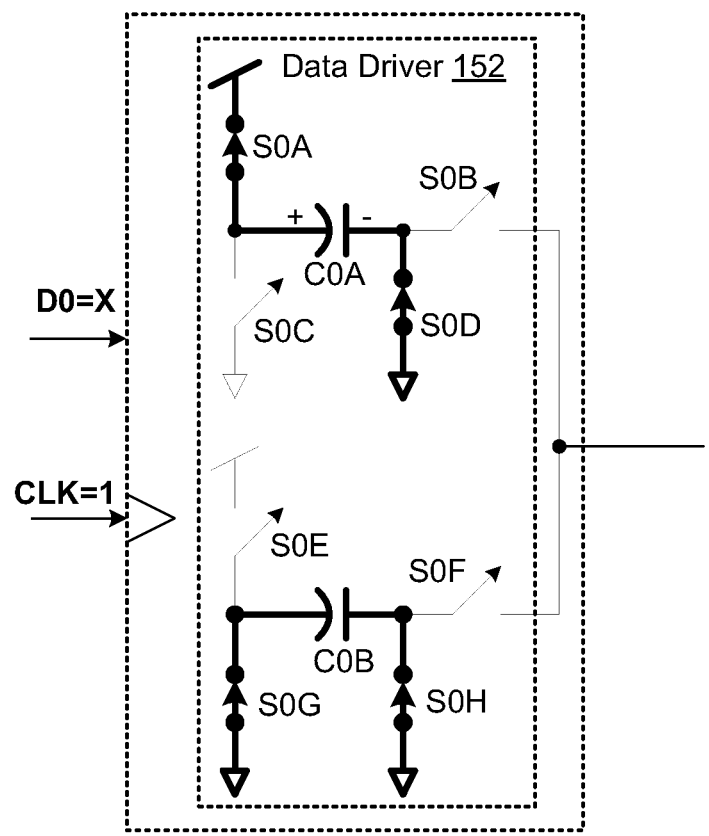
FIG. 1D illustrates operation of a data driver in a pre-charge state, in accordance with one embodiment.

FIG. 1D illustrates operation of data driver 152 in a pre-charge state, in accordance with one embodiment. As shown, when CLK is equal to a logical "1" value, switch S0A is active, coupling a first node of capacitor C0A to a positive supply rail, and switch S0D is active, coupling a second node of capacitor C0A to a local ground net. At the same time, switch S0G is active, coupling a first node of capacitor C0B to ground, and switch S0H is active, coupling a second node of capacitor C0B to ground. By the end of this pre-charge state, capacitor C0B is substantially discharged.

Figure 1E:
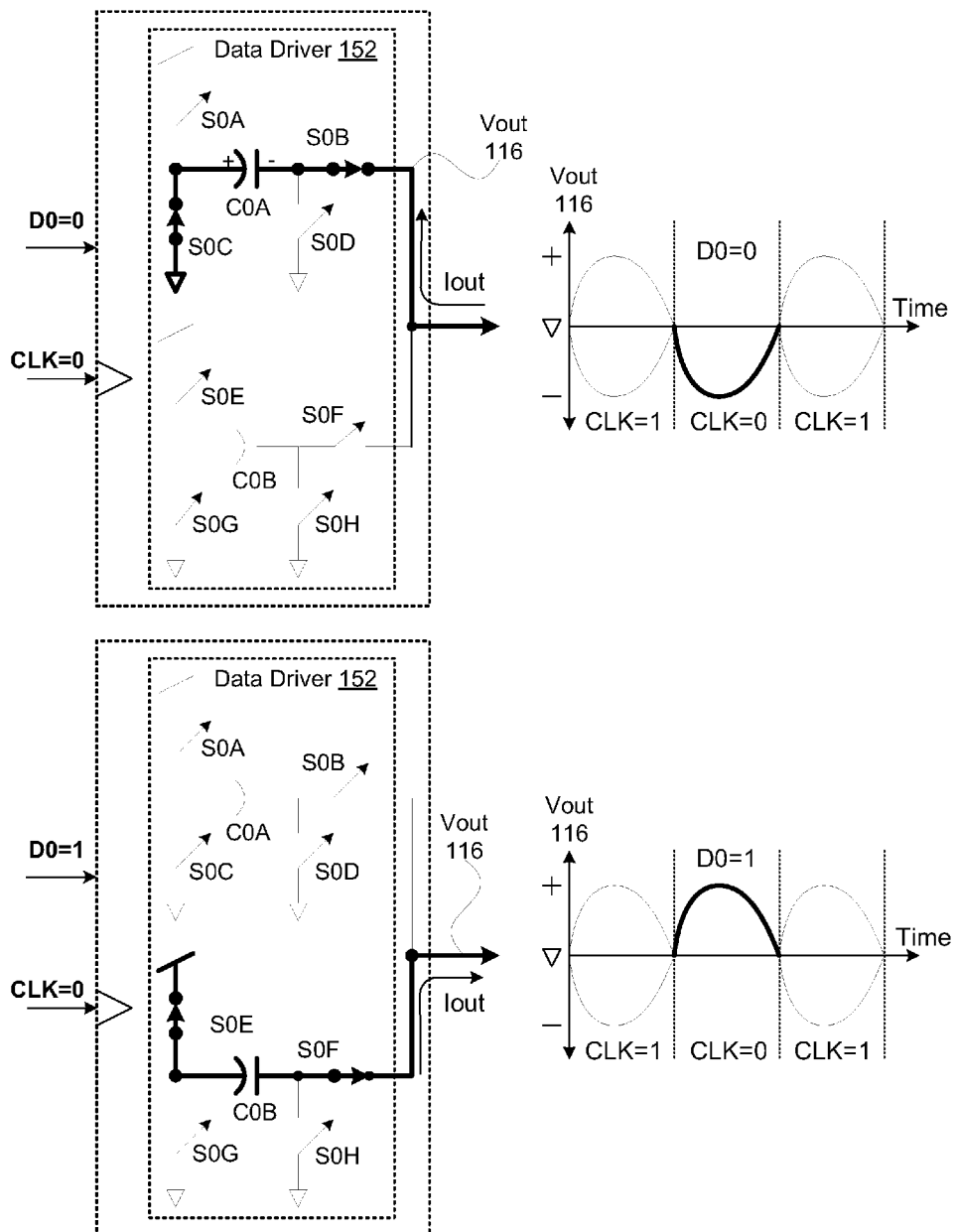
FIG. 1E illustrates operation of a data driver in different data-dependent drive states, in accordance with one embodiment.

FIG. 1E illustrates operation of data driver 152 in different data-dependent drive states, in accordance with one embodiment. As shown, when CLK is equal to a logical "0" value and D0 is equal to a logical "0" value, switches S0C and S0B are configured to couple capacitor C0A to Vout 116 to transmit a pulse having a negative polarity. Alternatively, when CLK is equal to a logical "0" value and D0 is equal to a logical "1" value, switches S0E and S0F are configured to couple capacitor C0B to Vout 116 to transmit a pulse having a positive polarity. Here, the positive supply rail is assumed to have adequate high-frequency capacitive coupling to the local ground net to force transient return current through the local ground net in conjunction driving Vout 116 with a positive pulse.

More illustrative information will now be set forth regarding various optional architectures and features with which the foregoing framework may or may not be implemented, per the desires of a designer or user. It should be strongly noted that the following information is set forth for illustrative purposes and should not be construed as limiting in any manner. Any of the following features may be optionally incorporated with or without the exclusion of other features described.

Figure 1F:
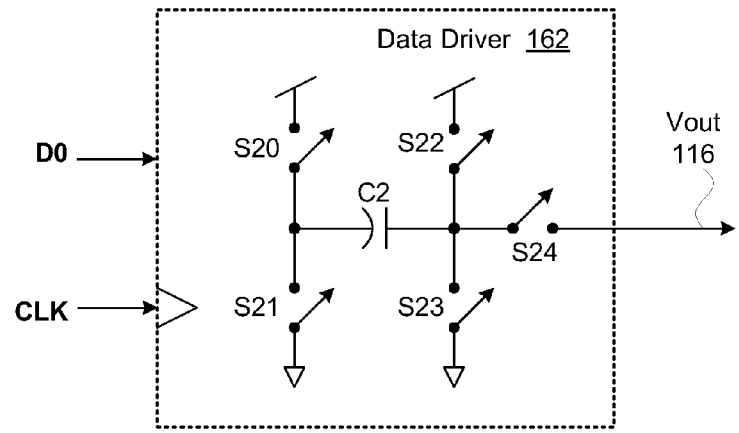
FIG. 1F illustrates operation of a ground-referenced single-ended data driver based on a flying capacitor charge pump, in accordance with one embodiment.

FIG. 1F illustrates operation of a ground-referenced single-ended data driver 162 based on a flying capacitor charge pump, in accordance with one embodiment. One or more instances of data driver 162 may be configured to operate as data drivers within a GRS transmitter. For example, an instance of data driver 162 may be configured to operate in place of data driver 112 within GRS transmitter 110 of FIG. 1A. Similarly, an instance of data driver 162 may be configured to operate in place of data driver 114.

Data driver 162 includes capacitor C2, and switches S20, S21, S22, S23, and S24, configured to pre-charge capacitor C2 during a pre-charge phase, and discharge capacitor C2 into Vout 116 during a data output phase. In one embodiment, a first instance of data driver 162 is configured to operate in a pre-charge phase when a dock signal is in a logical "0" state and a data output phase when the clock signal is in a logical "1" state. A second instance of data driver 162 is configured to operate in a pre-charge phase when the clock signal is in a logical "1" state and a data output phase when the clock signal is in a logical "0" state.

When each instance of data driver 162 is in the pre-charge phase, if D0 is in a logical "1" state, then switches S22 and S21 are active, while switches S20, S23, and S24 are inactive. While in the pre-charge phase, if D0 is in a logical "0" state, then switches S20 and S23 are active, while switches S21, S22, and S24 are inactive, During a data output phase, switches S21 and S24 are active, while switches S20, S22, and S23 are inactive. In sum, flying capacitor C2 is pre-charged with either a positive or negative polarity charge during the pre-charge phase. The charge is then discharged through ground and Vout 116 during the data output phase.

Figure 1G:
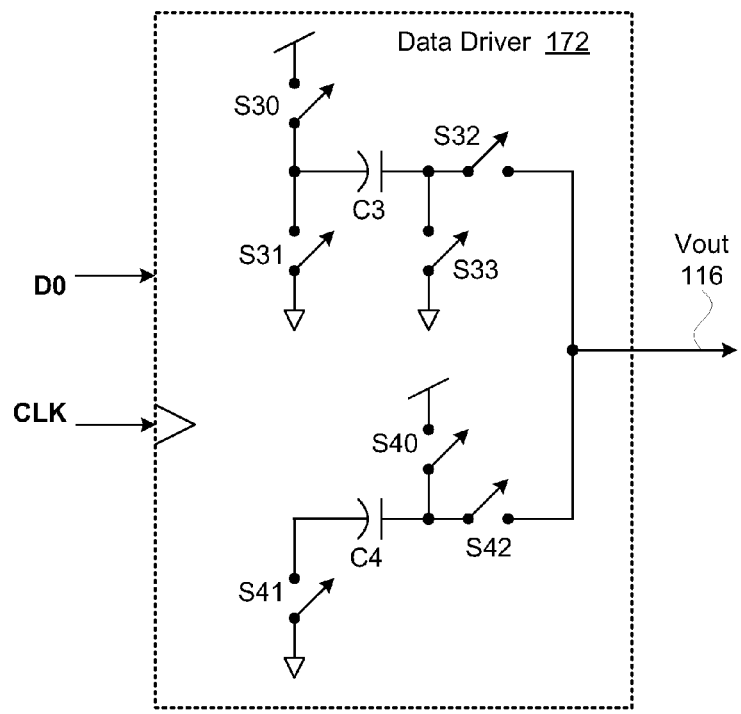
FIG. 1G illustrates operation of a ground-referenced single-ended data driver based on a dual capacitor charge pump, in accordance with one embodiment.

FIG. 1G illustrates operation of a ground-referenced single-ended data driver 172 based on a dual capacitor charge pump, in accordance with one embodiment. One or more instances of data driver 172 may be configured to operate as data drivers within a GRS transmitter. For example, an instance of data driver 172 may be configured to operate in place of data driver 112 within GRS transmitter 110 of FIG. 1A. Similarly, an instance of data driver 162 may be configured to operate in place of data driver 114.

Data driver 172 includes capacitors C3, C4, and switches S30, S31, S32, S33, S40, S41, and S42, configured to pre-charge capacitors C3 and C4 during a pre-charge phase, and discharge one of capacitors C3, C4 into Vout 116 during a data output phase. In one embodiment, a first instance of data driver 172 is configured to operate in a pre-charge phase when a clock signal is in a logical "0" state and a data output phase when the clock signal is in a logical "1" state. A second instance of data driver 172 is configured to operate in a pre-charge phase when the clock signal is in a logical "1" state and a data output phase when the clock signal is in a logical "0" state.

When each instance of data driver 172 is in the pre-charge phase, switches S30, S33, S40, and S41 are active, and switches S31, S32, and S42 are inactive During the data output phase, if D0 is in a logical "0" state, then switches S31 and S32 are active, allowing capacitor C3 to discharge a negative polarity charge into Vout 116. At the same time, switches S30, S33, and S40-S42 are inactive. During the data output phase, if D0 is in a logical "1" state, then switches S41 and S42 are active, allowing capacitor C4 to discharge a positive polarity charge into Vout 116. At the same time, switches S40 and S30-S33 are inactive.

Figure 2A:
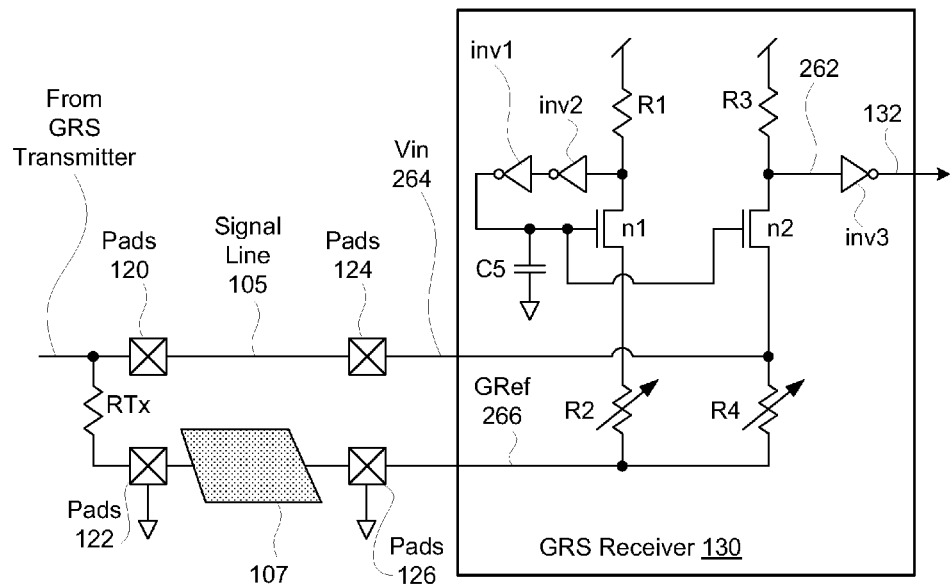
FIG. 2A illustrates an exemplary ground-referenced single-ended receiver, in accordance with one embodiment.

FIG. 2A illustrates an exemplary GRS receiver 130, in accordance with one embodiment. As shown, GRS receiver 130 receives input signals Vin 264 and GRef 266, and generates amplifier output signal 132. In one embodiment, an arriving pulse at Vin 264 having a positive voltage with respect to GRef 266 represents a logical "1" and an arriving pulse at Vin 264 having a negative voltage with respect to GRef 266 represents a logical "0". GRS receiver 130 amplifies a differential voltage between input signals Vin 264 and GRef 266 to generate a corresponding difference signal 262. In one embodiment, GRS receiver 130 is designed to bias difference signal 262 to be centered about a switching threshold for inverter inv3, which amplifies difference signal 262 to generate amplifier output signal 132 according to conventional logic voltage levels.

In one embodiment, GRS receiver 130 comprises resistors R1 through R4, inverters inv1 through inv3, capacitor C5, and field-effect transistors n1 and n2. Resistors R2 and R4 may be implemented as variable resistors, using any technically feasible technique. One exemplary implementation of a variable resistor provides digital control of a resistance value and comprises a set of n-channel FETs connected in a parallel configuration. Each n-channel FET is controlled by a different digital control signal from a control word used to establish the resistance value. If the control word is defined to be a binary number, a corresponding resistance value for the set of n-channel FETs may be monotonic if the n-channel FETs are sized appropriately. In a practical implementation, resistors R2 and R4 are tuned to balance the termination of incoming pulses and current injected into Vin 264 and GRef 266 by GRS receiver 130. A monotonic mapping from a binary code word to a resistance value simplifies any required digital trimming needed to achieve balanced termination. Any technically feasible technique may be implemented to adjust resistors R2 and R4 to achieve balanced termination.

Resistors R1 and R3 may also be implemented using any technically feasible technique. For resistors R1 and R3 may be implemented as p-channel FETs that are biased appropriately. Inverters inv1 and inv2 provide gain, while capacitor C5 serves to stabilize a loop formed by inverters inv1 and inv2, in conjunction with resistor R1 and FET n1.

Figure 2B:
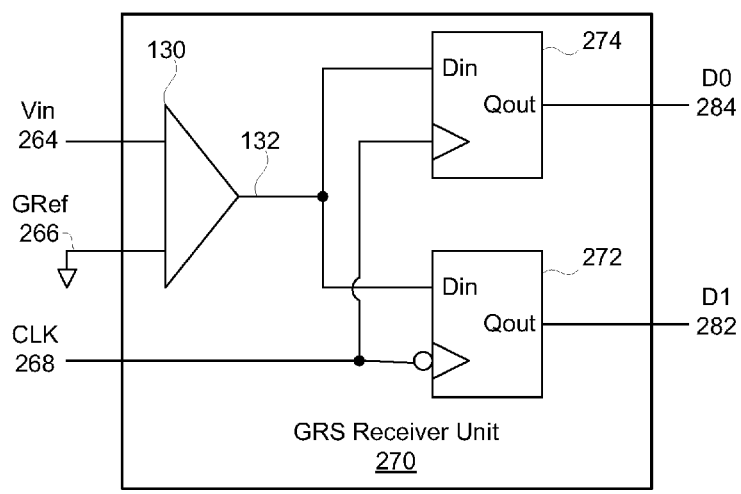
FIG. 2B illustrates an exemplary ground-referenced single-ended receiver, configured to demultiplex incoming data, in accordance with one embodiment.

FIG. 2B illustrates an exemplary GRS receiver unit 270, configured to demultiplex incoming data, in accordance with one embodiment. GRS receiver unit 270 comprises a GRS receiver 130, and storage elements configured to capture and store the logic state of amplifier output signal 132 on alternating clock phases to demultiplex input data represented as arriving pulses on input signal Vin 264, referenced to input signal GRef 266. Each output signal D0 284 and D1 282 presents captured input data at half the frequency of the arriving data pulses.

In one embodiment, the storage elements comprise a positive edge triggered flip-flop 274 and a negative edge triggered flip-flop 272. As shown, positive edge triggered flip-flop 274 is configured to capture D0 during the rising edge of a clock signal CLK 268, while negative edge triggered flip-flop 272 is configured to capture D1 during a falling edge of CLK 268. Such a configuration assumes that CLK 268 and amplifier output signal 132 transition together and that flip-flops 272 and 274 require more setup time than hold time. In alternative embodiments, D0 is captured on a falling edge of CLK 268, while D1 is captured on a rising edge of CLK 268. In other alternative embodiments, the storage elements comprise level-sensitive latches rather than flip-flops.

Figure 3:
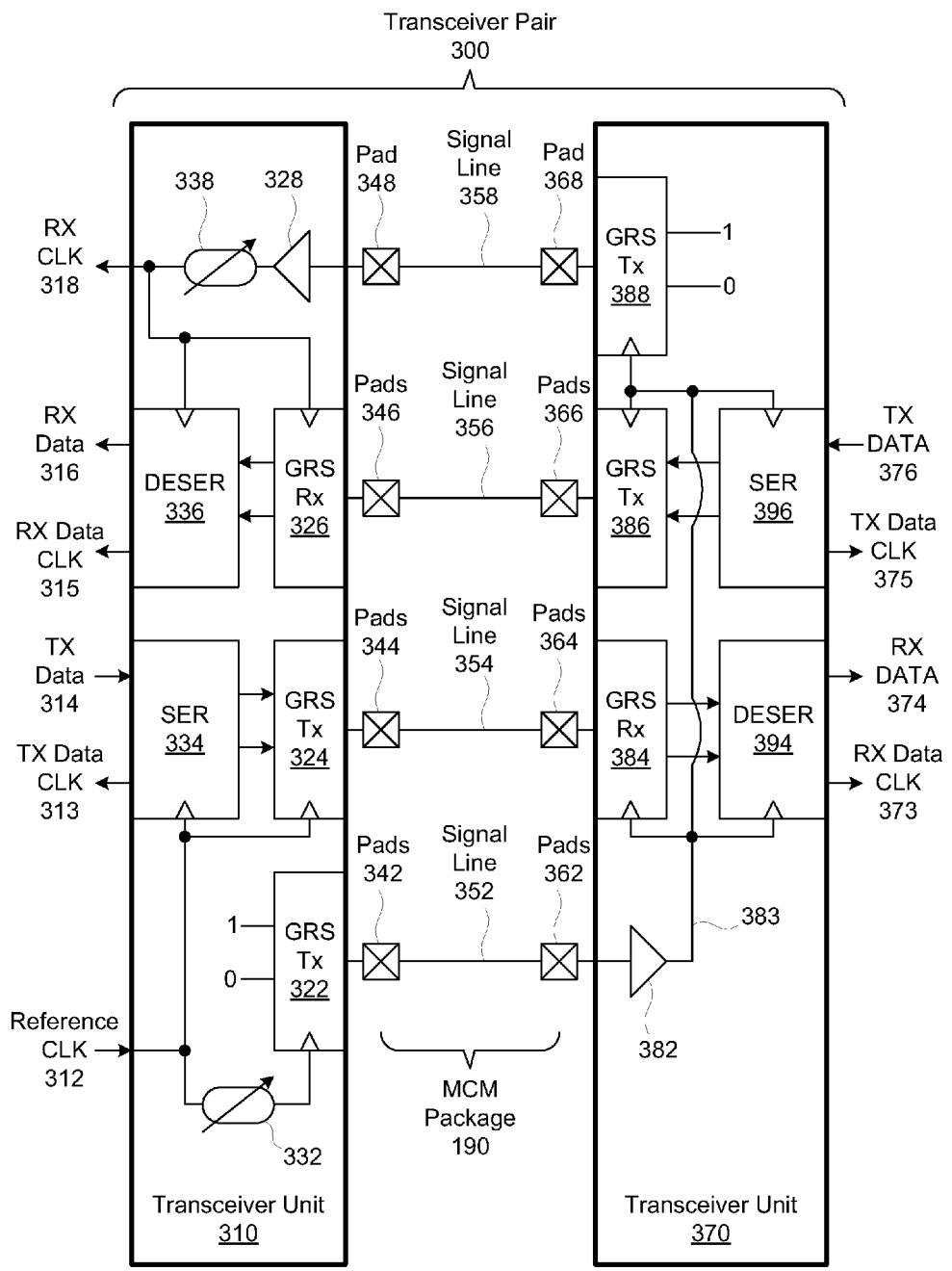
FIG. 3 illustrates an exemplary transceiver pair, configured to implement ground-referenced single-ended signaling, in accordance with one embodiment.

FIG. 3 illustrates an exemplary transceiver pair 300, configured to implement GRS signaling, in accordance with one embodiment. As shown, the transceiver pair 300 includes transceiver unit 310 coupled to transceiver unit 370 through signal lines 352, 354, 356, and 358. Signal lines 352, 354, 356, and 358 may be manufactured as controlled-impedance traces embedded within an MCM package 190. Transceiver 310 is configured to receive a reference clock 312 operating at one half the data transmission rate for the signal lines. Adjustable phase delay 332 may introduce an adjustable phase delay prior to transmitting reference clock 312 to GRS transmitter 322, GRS transmitter 324, and serializer 334.

As shown, the GRS transmitter 322 is configured to transmit a sequential "01" pattern to the GRS receiver 382 through pads 342, signal line 352, and pads 362. In one embodiment, this "01" pattern is transmitted at substantially the same phase as data transmitted from the GRS transmitter 324 to GRS receiver 384 through pads 344, signal line 354, and pads 364. Serializer 334 receives transmit data 314 at a lower frequency than reference clock 312, but at a correspondingly wider parallel width. For example, if reference clock 312 is configured to operate at 10 GHz, and serializer 334 is configured to multiplex a sixteen bit word into two bits for transmission through GRS transmitter 324, then sixteen bit words may arrive at orate of 10 GHz divided by eight or 1.25 GHz. Here, a transmission data dock 313 may be generated by serializer 334 to operate at 1.25 GHz for timing transfers of arriving transmit data 314. In this example, reference clock 312 has a 100 pS period and each distinct bit transmitted by GRS transmitters 322 and 324 has a unit interval of 50 pS.

GRS receiver 382 receives a phase-delayed version of reference clock 312 through signal line 352 and generates a local reference clock 383, which may be coupled to GRS receiver 384 for capturing arriving pulses on signal line 354. Local reference clock 383 may also be coupled to deserializer 394 for capturing and demultiplexing data from GRS receiver 384. Extending the above example, GRS receiver 384 may capture arriving pulses on alternating clock phases of local reference clock 383, operating at 10 GHz, to generate two bits every 100 pS. Deserializer 394 is configured to demultiplex sequential data comprising two bits from GRS receiver 384 and to generate corresponding sixteen-bit words at a rate of 1.25 GHz. The sixteen-bit words are presented as receive data 374. Deserializer 394 may generate receiver data clock 373 to reflect appropriate clocking for receive data 374. Receive data 374 represents a local copy of transmit data 314. In one embodiment, deserializer 394 is configured to align arriving data along word boundaries. Persons skilled in the art will understand that serialization and deserialization of parallel data may require alignment of the parallel data along word boundaries and that well-known techniques in the art may be implemented by transceiver unit 370 or associated logic without departing the scope and spirit of embodiments of the present invention.

Serializer 396 captures arriving transmit data 376 and serializes the data for transmission by GRS transmitter 386 through signal line 356. In one embodiment, serializer 396 generates transmit data clock 375 based on local reference clock 383 as a clocking reference for arriving transmit data 376. GRS receiver 326 captures the data arriving from signal line 356 and deserializer 336 demultiplexes the data into words, presented as receive data 316. GRS transmitter 388 is configured to transmit a sequential "01" pattern to GRS receiver 328 through pads 368, signal line 358, and pads 348. In one embodiment, this "01" pattern is transmitted at substantially the same phase as data transmitted from GRS transmitter 386 to GRS receiver 326 through pads 366, signal line 356, and pads 346. GRS receiver 328 and adjustable phase delay 338 generate receive clock 318 based on the sequential "01" pattern. In one embodiment, receive data clock 315 is generated by deserializer 336 to reflect appropriate docking for receive data 316.

Determining a proper phase delay value for adjustable phase delay 332 and adjustable phase delay 338 may be performed using any technically feasible technique. For example, phase delay values for adjustable phase delay 332 and adjustable phase delay 338 may be swept over a range of phase delay values during a link training phase, whereby phase delays corresponding to a substantially minimum bit error rate during training are determined and used for normal link operation.

Although an isochronous clocking model is illustrated herein for transmitting data between transceiver unit 310 and transceiver unit 370, any technically feasible clocking model may be implemented without departing the scope and spirit of embodiments of the present invention.

FIG. 4A illustrates a GRS data driver 400 comprising a CMOS circuit, in accordance with one embodiment. As shown, the CMOS circuit illustrates a circuit topology that may be used to implement the data driver 162 of FIG. 1F using CMOS circuit elements. Specifically, switches S20 and S22 are implemented as p-channel FET p40, and p-channel FET p42, respectively; and switches S21, S23, and S24 are implemented as n-channel FET n41, n-channel FET n43, and n-channel FET n44, respectively. A reference node 410 is coupled to a capacitor C7, p-channel FET p40 and n-channel FET n41. An output node 412 is coupled to an opposing side of capacitor C7, as well as to p-channel PET p42, n-channel FET n43, and n-channel FET n44.

Control signal g40 is coupled to a gate node of p-channel FET p40. When control signal 40 is driven to a logical 0 level, p-channel FET p40 turns on, pulling node 410 to a voltage level associated with VDD, Control signal g41 is coupled to a gate node of n-channel PET n41. When control signal g41 is driven to a logical 1 level, n-channel PET n41 turns on, pulling node 410 to a voltage level associated with GND. Similarly, p-channel FET p42 responds to control signal g42, selectively pulling node 412 to VDD, while n-channel PET n43 responds to control signal g43, selectively pulling node 412 to GND. Control signal g44 is coupled to a gate node of n-channel PET n44. When control signal g44 is driven to a logical 0 level, n-channel FET n44 substantially isolates node 412 from node Vout 416. However, when control signal g44 is driven to a logical 1 level, n-channel FET n44 forms a low impedance path between node 412 and Vout 416. As described below in conjunction with FIG. 4D, this low impedance path facilitates driving Vout 416 with an appropriate signal.

GRS data driver 400 operates primarily in three different states, including a first pre-charge state for subsequently driving a data value of zero, a second pre-charge state for subsequently driving a data value of one, and a drive state for driving a signal line, such as signal line 105, with a signal corresponding to a preceding pre-charge state. These states are illustrated below in FIGS. 4B-4D. Transitions between pre-charge states and the drive state are orchestrated by control signals g40 through g44.

FIG. 4B illustrates GRS data driver 400 in the first pre-charge state that is associated with driving a data value of zero, in accordance with one embodiment. As shown, in the first pre-charge state, control signal g40 is set to zero, to turn on p-channel FET p40, thereby coupling node 410 to VDD. At the same time, control signal g43 is set to one (1), to turn on n-channel PET n43, thereby coupling node 412 to GND. Also, control signal g42 is set to one to turn off p-channel FET p42, and control signals g41 and g44 are set to zero to turn off n-channel PET n41 and n-channel FET n44, respectively. In this first pre-charge state, capacitor C7 is charged with a positive charge on node 410 and a negative charge on node 412, which is electrically isolated from node Vout 416.

FIG. 4C illustrates GRS data driver 400 in the second pre-charge state that is associated with driving a data value of one, in accordance with one embodiment. As shown, in the second pre-charge state, control signal g42 is set to zero, to turn on p-channel FET p42, thereby coupling node 412 to VDD. At the same time, control signal g41 is set to one, to turn on n-channel FET n41, thereby coupling node 410 to GND. Also, control signal g40 is set to one to turn off p-channel FET p40, and control signals g43 and g44 are set to zero to turn off n-channel FET n43 and n-channel FET n44, respectively. In this second pre-charge state, capacitor C7 is charged with a negative charge on node 410 and a positive charge on node 412, which is electrically isolated from node Vout 416.

Figure 4D:
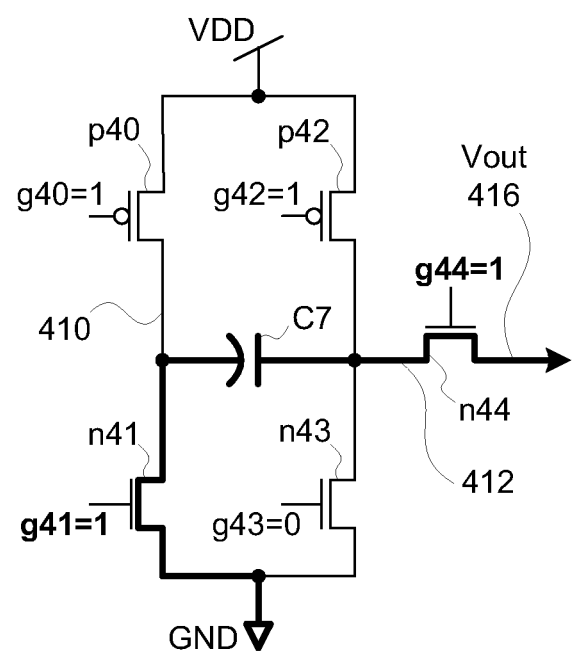
FIG. 4D illustrates a ground-referenced single-ended data driver in a drive state, in accordance with one embodiment.

FIG. 4D illustrates GRS data driver 400 in a drive state, in accordance with one embodiment. As shown, control signal g41 is set to one, coupling node 410 to GND and control signal g44 is set to one, coupling node 412 to node Vout 416. Control signals g40 and g42 are set to one, to turn off p-channel FET p40 and p-channel FET p42, respectively. Additionally, control signal g43 is set to zero, to turn off n-channel FET n43. In this state, capacitor C7 discharges into node Vout 416.

If a negative charge has been accumulated in capacitor C7 in a previous pre-charge state, then C7 discharges the negative charge into node Vout 416 with respect to GND. Otherwise, if a positive charge has been accumulated in capacitor C7 in a previous pre-charge state, then C7 discharges a positive charge into node Vout 416 with respect to GND. Current passing through node Vout 416 is substantially balanced with a corresponding ground current passing through GND.

Capacitor C7 may be implemented using any technically feasible technique without departing the scope and spirit of embodiments of the present invention. In one embodiment, the capacitor C7 is implemented using n-channel FETs. For example, a gate node of a first n-channel FET may be coupled to node 412 of FIG. 4A to form a back-to-back metal-oxide transistor capacitor. Additionally, source and drain nodes of the first n-channel FET may be coupled to node 410. A gate node of a second n-channel FET may be coupled to node 410, while source and drain nodes of the second n-channel FET may be coupled to node 412. Gate capacitance is relatively area-efficient compared to other capacitor structures available within a CMOS process. However, gate capacitance varies significantly with charge polarity. To compensate for polarity-dependent gate capacitance, two n-channel devices are symmetrically configured to store charge in opposite polarities. In this way, a positive pulse discharged into node Vout 416 has a substantially equal magnitude relative to a negative pulse discharged into Vout 416.

In another embodiment, the capacitor C7 may be implemented using traces in adjacent metal layers. For example, traces in sequential metal layers may be configured to provide plate capacitance (Cp) and edge capacitance (Ce) between nodes 410 and 412. Unlike gate capacitance, plate and edge capacitance between metal structures embedded within conventional dielectric materials are stable with respect to polarity. However, a capacitor formed using metal layer traces may require more die area compared to a capacitor formed using gate capacitance for an equivalent capacitance value. While two parallel traces on two adjacent layers may be used to implement the capacitor C7, one skilled in the art will understand that such a metal-oxide-metal (MOM) capacitor can be realized using more than two layers and more than two adjacent traces on each layer.

Figure 5A:
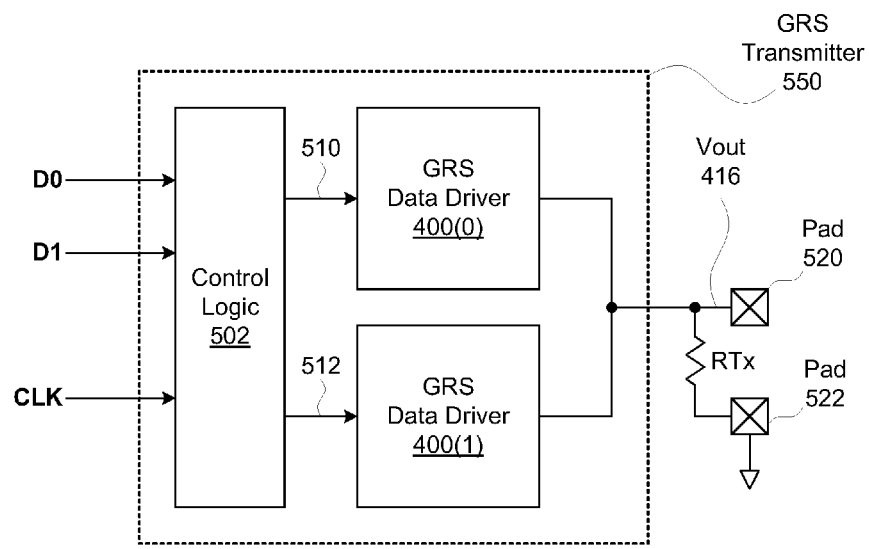
FIG. 5A illustrates a ground-referenced single-ended transmitter comprising two instances of a ground-referenced single-ended data driver, in accordance with one embodiment.

FIG. 5A illustrates a GRS transmitter 550 comprising two instances of a GRS data driver 400, in accordance with one embodiment. As shown, GRS transmitter 550 receives data input signals D0 and D1 that are synchronized to dock signal CLK. Control logic 502 receives signals D0, D1 and CLK, and, in response, generates driver control signals 510 and driver control signals 512. In one embodiment, driver control signals 510 comprise control signals g40 through g44 for instance 400(0) of GRS data driver 400, and driver control signals 512 comprise control signals g40 through g44 for instance 400(1) of GRS data driver 400.

In one embodiment, when CLK is in a logical one state, control logic 502 configures instance 400(0) to operate in a pre-charge state. If D0 is in a logical zero state, then instance 400(0) enters the pre-charge state associated with driving a data value of zero, illustrated previously in FIG. 4B. Here, driver control signals 510 are generated such that g40=0, g41=0, g42=1, g43=1, and g44=0. If, instead, D0 is in a logical one state, then instance 400(0) enters the pre-charge state associated with driving a data value of one, illustrated previously in FIG. 4C. Here, driver control signals 510 are generated such that g40=1, g41=1, g42=0, g43=0, and g44=0. When CLK is in a logical zero state, control logic 502 configures instance 400(0) to operate in the drive state, illustrated previously in FIG. 4D. Here, driver control signals 510 are generated such that g40=1, g41=1, g42=1, g43=0, and g44=1.

When CLK is in a logical zero state, control logic 502 configures instance 400(1) to operate in a pre-charge state. If D1 is in a logical zero state, then instance 400(1) enters the pre-charge state associated with driving a data value of zero, illustrated previously in FIG. 4B. Here, driver control signals 512 are generated such that g40=0, g41=0, g42=1, g43=1, and g44=0. If, instead, D1 is in a logical one state, then instance 400(1) enters the pre-charge state associated with driving a data value of one, illustrated previously in FIG. 4C. Here, driver control signals 512 are generated such that g40=1, g41=1, g42=0, g43=0, and g44=0. When CLK is in a logical one state, control logic 502 configures instance 400(1) to operate in the drive state, illustrated previously in FIG. 4D. Here, driver control signals 510 are generated such that g40=1, g41=1, g42=1, g43=0, and g44=1.

Each instance 400(0), 400(1) is coupled to a common Vout 416 signal, which is further coupled to a pads 520. In one embodiment, Vout 416 is coupled to pads 522 through resistor RTx. Pads 522 are coupled to a circuit ground node, corresponding to GND in FIGS. 4A-4D.

In one embodiment, CMS transmitter 550 is configured to replace GRS transmitter 110 of FIG. 1A. Here, pads 520 couple Vout 416 to signal line 105 and pads 522 couple GND to ground network 107. In such a configuration, GRS receiver 130 receives data from GRS transmitter 550. In certain embodiments, GRS transmitter 550 comprises GRS Tx 322, GRS Tx 324, GRS Tx 386, and GRS Tx 388 of FIG. 3.

Figure 5B:
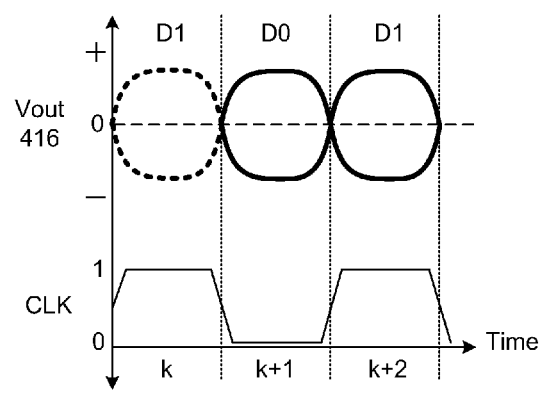
FIG. 5B illustrates timing for a ground-referenced single-ended transmitter comprising two ground-referenced single-ended data drivers, in accordance with one embodiment.

FIG. 5B illustrates timing for a GRS transmitter 550, in accordance with one embodiment. As shown, one bit of data from input D0 is transmitted to Vout 416 during time k+1 when CLK is in a logical zero state, and one bit of data from input D1 is transmitted to Vout 416 during time k+2 when CLK is in a logical one state. In one embodiment, inputs D0 and D1 are synchronous to and are updated on the rising edge of CLK. In such an embodiment, instance 400(1) is in a data driving state when inputs D0 and D1 change in response to a rising edge of CLK going into time k. On the rising edge of CLK going into time k, instance 400(0) enters a pre-charge state, thereby sampling data on D0. On the falling edge of CLK exiting time k and entering time k+1, instance 400(0) enters a data driving state and drives the captured data from D0 onto Vout 416. On the falling edge of CLK going into time k+1, instance 400(1) enters a pre-charge state, thereby sampling data on D1. On the rising edge of CLK exiting time k+1 and entering time k+2, instance 400(1) enters a data driving state and drives the captured data from D1 onto Vout 416. In this way, data comprising D0 and D1 may be presented to GRS transmitter 550 using conventional logic having conventional single-edge synchronous timing, while GRS transmitter 550 time-multiplexes the data for transmission at a double data rate. In other words, two data transfers occur in each period or cycle of the CLK. In a preferred embodiment, D0 is latched when CLK is low to ensure that D0 is stable while being used to control the pre-charge of instance 400(0). Similarly, D1 is latched when CLK is high to ensure D1 is stable while being used to control the pre-charge of instance 400(1).

In other embodiments, a GRS transmitter comprising more than two instances of GRS data driver 400 is configured to receive a data bit per instance of GRS data driver 400 and to time-multiplex the data at a correspondingly higher data rate. In such embodiments, multiple clock signals may be required to provide appropriate timing for pre-charging and driving data to time-multiplex the data.

Figure 5C:
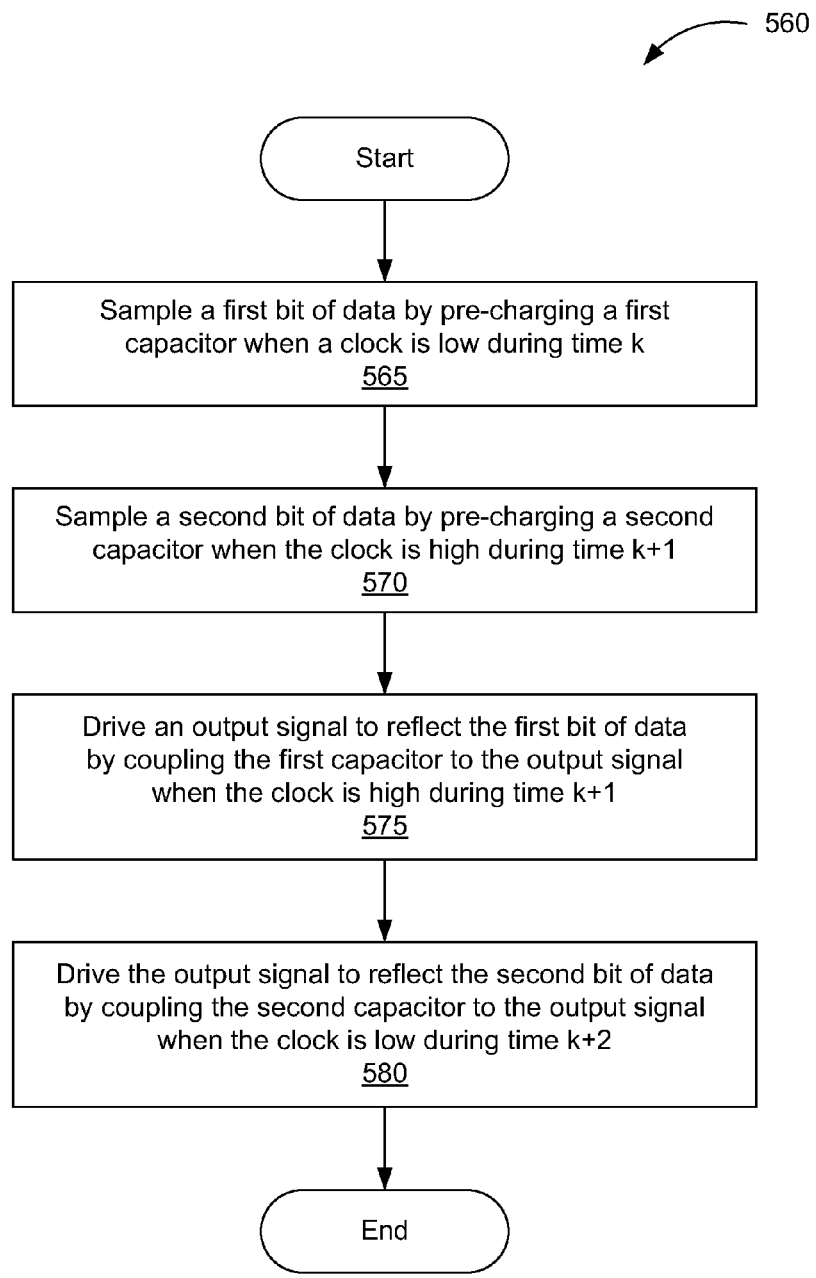
FIG. 5C illustrates a flow chart of a method for generating aground-referenced single-ended signal, in accordance with one embodiment.

FIG. 5C illustrates a flow chart of a method 560 for generating a ground-referenced single-ended signal, in accordance with one embodiment. Although method 560 is described in conjunction with FIGS. 4A-5B to implement a two to one time-multiplexing ratio of input data to output data, persons of ordinary skill in the art will understand that any system that performs method 560 is within the scope and spirit of embodiments of the present invention.

Method 560 begins in step 565, where a first data driver, such as instance 400(0) of GRS data driver 400, samples a first bit of data by pre-charging a first capacitor during a first time k. The first capacitor is charged to have a polarity corresponding to a logic level for the first bit of data. In step 570, a second data driver, such as instance 400(1) of GRS data driver 400, samples a second bit of data by pre-charging a second capacitor during a time k+1. The second capacitor is charged to have a polarity corresponding to a logic level for the second bit of data.

In step 575, the first data driver drives an output signal, such as Vout 416 of FIG. 4A-4D or Vout 416 of FIG. 5A, to reflect the first bit of data by coupling the first capacitor to the output signal during the time k+1. Here, the first capacitor is coupled between a ground network and the output signal. The polarity of charge on the first capacitor was established in step 565, based on the logic level for the first bit of data. When coupled to the output signal, the first capacitor therefore reflects the logic level for the first bit of data.

In step 580, the second data driver drives the output signal to reflect the second bit of data by coupling the second capacitor to the output signal during a time k+2. Here, the second capacitor is coupled between a ground network and the output signal. The polarity of charge on the second capacitor was established in step 570, based on the logic level for the second bit of data. When coupled to the output signal, the second capacitor therefore reflects the logic level for the second bit of data. Method 560 terminates after driving the output signal to reflect the second bit of data.

In other embodiments, a time-multiplexing ratio of greater than two may be implemented and at least one additional phase-related clock may be provided to orchestrate operation of more than three instances of GRS data driver 400.

System-on-Package with Ground-Referenced Signaling

Figure 6A:
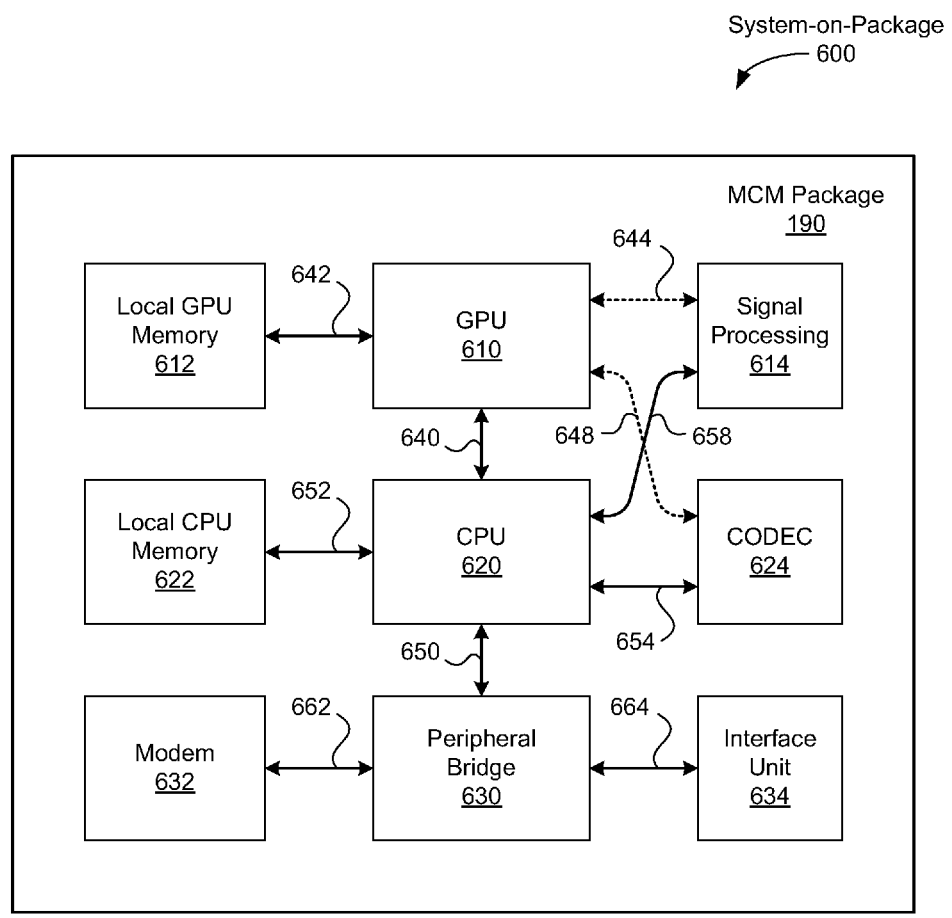
FIG. 6A illustrates an exemplary system-on-package, in accordance with one embodiment.

FIG. 6A illustrates an exemplary system-on-package 600, in accordance with one embodiment. As shown, system-on-package 600 comprises a graphics processing unit (GPU) chip 610, a central processing unit (CPU) chip 620, and a system function chip, such as a peripheral bridge chip 630 mounted within a multi-chip module package 190. A local GPU memory 612 is mounted within multi-chip module package 190 and coupled to GPU chip 610. Local GPU memory 612 may comprise one or more memory chips, which may be manufactured form a vertical chip-on-chip stack. Similarly, a local CPU memory 622 is mounted within multi-chip module package 190 and coupled to GPU 620. Local CPU memory 622 may comprise one or more memory chips, which may be manufactured to form a vertical chip-on-chip stack.

Peripheral bridge chip 630 may be coupled to a modem chip 632, and an interface unit chip 634. In one embodiment, peripheral bridge chip 630 is configured to perform as a bridge for transmitting data between data CPU chip 620 and modem chip 632. Similarly, peripheral bridge chip 630 may be configured to perform as a bridge for transmitting data between CPU chip 620 and interface unit chip 634. In an alternate embodiment, modem chip 632 and/or interface unit chip 634 may be connected directly to the CPU.

A signal processing chip 614 may be included within system-on-package 600 as another system function chip and configured to provide efficient, high-performance signal processing functionality. The signal processing chip 614 may be configured to operate on any form of signal data, including one-dimensional signals and two-dimensional signals. A coder-decoder (CODEC) chip 624 may be included within system-on-package 600 as yet another system function chip and configured to provide video, audio, or both video and audio encoding and decoding operations.

In the context of the following description, GPU chip 610 may comprise one or more graphics processing unit cores, each configured to execute a plurality of concurrent thread programs. In one embodiment, a GRS interconnect 642 couples GPU chip 610 to local GPU memory 612, and a different GRS interconnect 640 couples GPU chip 610 to CPU chip 620. In certain embodiments, GRS interconnect 644 couples GPU chip 610 to signal processing chip 614, and GRS interconnect 648 couples GPU chip 610 to CODEC chip 624. In one embodiment, GPU local memory 612 comprises DRAM memory chips that each include a GRS interface coupled to GRS interconnect 642. In an alternative embodiment, GPU local memory 612 comprises a shim interface chip that includes GRS interfaces coupled between memory chips and GRS interconnect 642. For example, the shim interface chip is coupled to MCM package 190, and to a vertical stack of one or more DRAM chips, each configured to include a conventional DRAM electrical interface. In one embodiment, GRS interconnects 640, 642, 644, and 648 are implemented as electrical traces within MCM package 190. Each trace may comprise a conductive element affixed to a dielectric substrate, such as an organic, ceramic, or silicon substrate layer of MCM package 190. Each electrical trace may be configured to exhibit a controlled electrical impedance. In some embodiments, the GPU chip 610 may be divided into several chips that are connected to each other using GRS interfaces.

CPU chip 620 may comprise one or more general purpose processing unit cores, each configured to execute at least one instruction stream. In one embodiment, a GRS interconnect 652 couples CPU chip 620 to local CPU memory 622, and a different GRS interconnect 650 couples CPU chip 620 to peripheral bridge chip 630. Furthermore, GRS interconnect 658 may couple CPU chip 620 to signal processing chip 614, and GRS interconnect 654 may couple CPU chip 620 to CODEC chip 624. In one embodiment, GRS interconnects 650, 652, 654 and 658 are implemented as electrical traces within MCM package 190. Each trace may comprise a conductive element affixed to a dielectric substrate, such as an organic, ceramic, or silicon substrate layer of MCM package 190. Each electrical trace may be configured to exhibit a controlled electrical impedance.

In one embodiment, CPU local memory 622 comprises DRAM memory chips that each includes a GRS interface coupled to GRS interconnect 652. In an alternative embodiment. CPU local memory 622 comprises a shim interface chip that includes GRS interfaces coupled between memory chips and GRS interconnect 652. For example, the shim interface chip is coupled to MCM package 190, and to a vertical stack of one or more DRAM chips, each configured to include a conventional DRAM electrical interface.

Modem chip 632 may be configured to provide wired or wireless network connectivity to a digital data network, such as a radio-frequency wireless local area network (LAN) or wireless cellular network. In one embodiment, modem chip 632 implements IEEE standard 802.11 ("WiFi") wireless LAN protocols. In another embodiment, modem chip 632 implements long term evolution (LTE/LTE-A) protocols. Interface unit 634 may provide certain specific interface functions, such as audio reproduction or sampling, wired digital communication, analog-to-digital signal conversion, and the like. Wired digital communication may implement, without limitation, one or more I2C ports, one or more PCI-express ports, one or more universal serial bus (USB) ports, one or more Ethernet ports, one or more serial advanced technology attachment (SATA) ports, or any combination thereof. Interface unit 634 may be implemented as a discrete chip or integrated into another chip, such as peripheral bridge chip 630. In one embodiment, interconnect 662 comprises a GRS interconnect. In certain embodiments, interconnect 664 comprises a GRS interconnect.

Each different GRS interconnect may comprise an arbitrary number of GRS signals, according to bandwidth and latency requirements for the GRS interconnect. For example, GRS interconnect 642 may comprise sixteen GRS channels to support high memory bandwidth and low transfer latency, while GRS interconnect 650 may comprise one GRS channel, which is able to provide more than adequate bandwidth and latency for data transfers between CPU chip 620 and functions associated with the peripheral bridge chip 630. In certain embodiments, one or more of the GRS interconnects include bidirectional data signals for reduced overall signal count.

Different configurations of system-on-package 600 may include different generations or different configurations of one or more constituent chips, each potentially manufactured with a different fabrication process. In one example, a new generation of system-on-package 600 may be designed to upgrade the CPU chip 610 to a new generation device, while retaining an otherwise identical design to a previous generation of system-on-package 600. In one example, an older generation of CPU chip 610 may be replaced with a new generation of CPU chip 610, in newly manufactured system-on-package 600 devices. In another example, an older generation of CODEC chip 624 may be replaced with a new generation CODEC chip 624 in newly manufactured system-on-package 600 devices. Here, the new generation CODEC chip 624 may offer higher performance, offer better power efficiency, offer support additional features and formats not available in an older generation device, or any combination thereof.

While an exemplary interconnect topology is illustrated in conjunction with system-on-package 600, other technically feasible interconnect topologies may be implemented without departing the scope and spirit of the present invention. As shown, CPU chip 620 is coupled to CPU chip 610 and to peripheral bridge chip 630. As shown in FIG. 6A, CPU chip 620 may act as a bridge between system CPU chip 610 and peripheral bridge chip 630, which further acts as a bridge between modem chip 632 and CPU chip 620. Alternative topologies are illustrated below in FIGS. 6B and 6C.

Figure 6B:
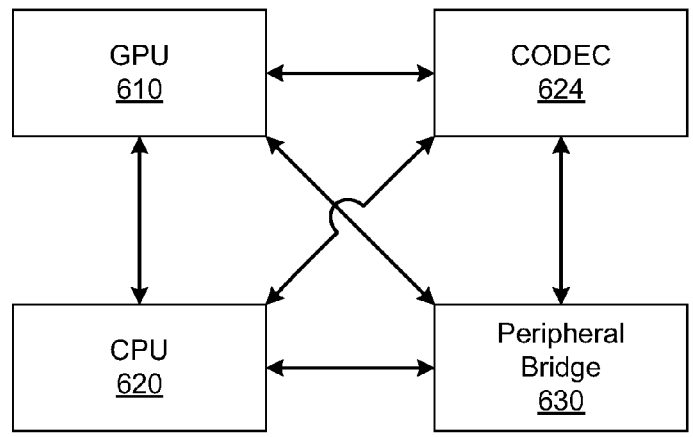
FIG. 6B illustrates a fully-connected topology among major functions within an exemplary system-on-package, in accordance with one embodiment.

FIG. 6B illustrates a fully-connected topology among major functions within exemplary system-on-package 600, in accordance with one embodiment. As shown, a fully-connected network couples together major chips comprising system-on-package 600 including, CPU chip 610, CPU chip 620, CODEC chip 624, and peripheral bridge chip 630. Each chip comprises a node within a fully-connected network that includes a direct connection between each pair of nodes. One or more of the connections shown in FIG. 6B may be implemented using a corresponding GRS interconnect. In one embodiment, method 560 of FIG. 5C is performed to generate GRS signals transmitted over one or more of the connections shown in conjunction with FIG. 6B. A non-degenerate fully connected topology emerges with at least three nodes. Certain embodiments implement a hybrid interconnect topology, whereby an additional chip may be coupled to one of the fully-connected node chips.

Figure 6C:
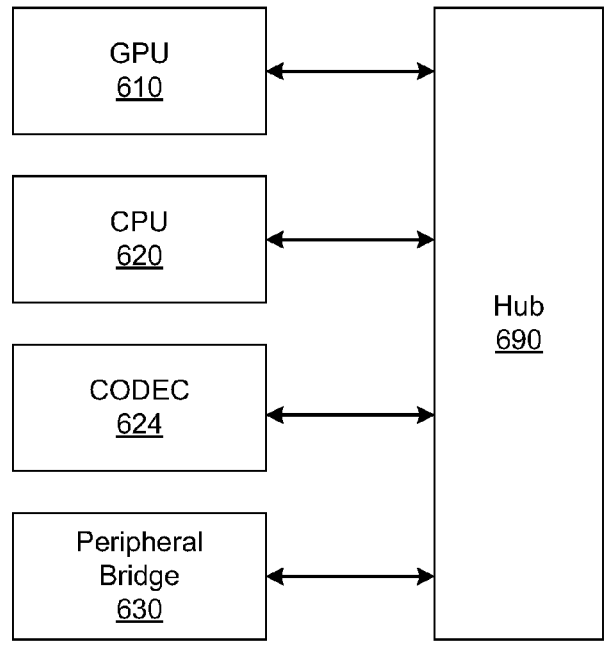
FIG. 6C illustrates a hub-based topology connecting major functions within an exemplary system-on-package, in accordance with one embodiment.

FIG. 6C illustrates a hub-based topology connecting major functions within exemplary system-on-package 600, in accordance with one embodiment. As shown, client chips including GPU chip 610, CPU chip 620, CODEC chip 624, and peripheral bridge chip 630 within system-on-package 600 are coupled to a system function chip, such as a hub chip 690, which routes data between each client chip. In certain embodiments, local CPU memory 612 may be coupled to hub chip 690 as a client rather than CPU chip 610, and local CPU memory 622 may be coupled to hub chip 690 as a client rather than CPU chip 620. One or more of the connections shown in FIG. 6C may be implemented using a corresponding GRS interconnect. In one embodiment, method 560 of FIG. 5C is performed to generate GRS signals transmitted over one or more of the connections shown in conjunction with FIG. 6C.

In certain embodiments, an initiator circuit (not shown) is configured to generate a request that is routed to a target circuit. The request may include a read request to be processed by the target circuit, a write request to be processed by the target circuit, a command to be processed by the target circuit, or any other technically feasible request to be processed by the target circuit. For example, an initiator circuit within CPU chip 620 may generate an access request to read or write data stored within CPU chip 610. A target circuit within CPU chip 610 may then process the access request by replying with requested data if the access request is a read request, or writing data associated with an access request to a designated location if the access request is a write request. A given access request may include a target address and associated data. If the access request needs to be routed by a system function chip, such as peripheral bridge chip 630 or hub chip 690, then the access request may be examined by the system function chip to determine where to forward the access request.

In one embodiment, an access request is generated within an initiating device for transmission to a target device for processing. The access request comprises a set of request fields, including, without limitation, an address field, which may uniquely identify the target device and a specific address within the target device. The access request is transmitted over a GRS interconnect to the target device. At least one GRS transmitter associated with the GRS interconnect is configured to transmit serialized data comprising the access request until the access request is transmitted in full to a GRS receiver within the target device. The at least one GRS transmitter may implement two or more degrees of multiplexing by implementing a corresponding number of GRS data drivers and appropriate clocking circuitry. The at least one GRS transmitter may be configured to perform method 560 to generate individual bits comprising the serialized data for transmission to the target device. Exemplary GRS transmitters illustrated in FIGS. 1A-5B implement two to one multiplexing; however, persons skilled in the art will understand that arbitrary degrees of multiplexing may be similarly implemented without departing the scope and spirit of embodiments of the present invention. The target device may deserialize the serialized bits to construct the access request. If the target device is configured to serve as a bridge or hub, then the access request may be forwarded to a destination target device for processing.

In one embodiment, a non-transitory computer readable medium is configured to represent a detailed design of MCM package 190, including all electrical connections. Such electrical connections include electrical traces designed to support ground-referenced single-ended signals, including, without limitation, GRS interconnects 640, 642, 644, 648, 650, 652, 654 and 658. Each GRS interconnect may include an abstract representation of connectivity, such as connectivity represented within a net list. Individual traces may be represented as code within a net list file. Persons skilled in the art will understand that many net list formats are available, and any technically feasible non-transitory computer readable medium configured to represent system-on-package 600 is within the scope and spirit of the present invention.

Figure 7:
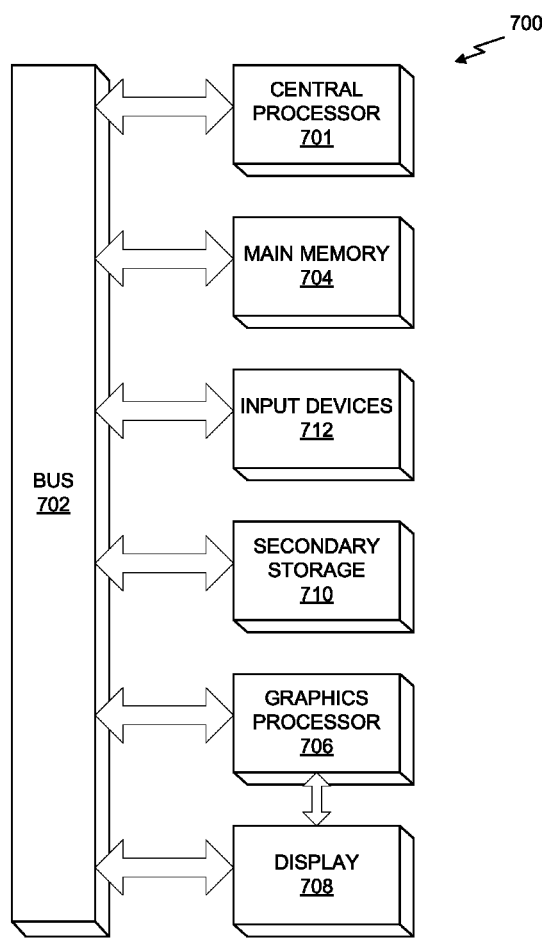
FIG. 7 illustrates an exemplary system in which the various architecture and/or functionality of the various previous embodiments may be implemented.

FIG. 7 illustrates an exemplary system 700 in which the various architecture and/or functionality of the various previous embodiments may be implemented. As shown, a system 700 is provided including at least one central processor 701 that is connected to a communication bus 702. The communication bus 702 may be implemented using any suitable protocol, such as PCI (Peripheral Component Interconnect), PCI-Ex press, AGP (Accelerated Graphics Port), Hyper-Transport, or any other bus or point-to-point communication protocol(s). The system 700 also includes a main memory 704. Control logic (software) and data are stored in the main memory 704, which may take the form of random access memory (RAM). In one embodiment, central processor 701, graphics processor 706, a portion of bus 702 configured to interconnect the central processor 701 and graphics processor 706, and at least a portion of main memory 704 comprise a system-on-package, such as system-on-package 600 of FIGS. 6A, 6B, and 6C.

The system 700 also includes input devices 712, a graphics processor 706, and a display 708, i.e. a conventional CRT (cathode ray tube), LCD (liquid crystal display), LED (light emitting diode), plasma display or the like. User input may be received from the input devices 712, e.g., keyboard, mouse, touchpad, microphone, and the like. In one embodiment, the graphics processor 706 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 700 may also include a secondary storage 710. The secondary storage 710 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner. Computer programs, or computer control logic algorithms, may be stored in the main memory 704 and/or the secondary storage 710. Such computer programs, when executed, enable the system 700 to perform various functions. The main memory 704, the storage 710, and/or any other storage are possible examples of computer-readable media.

In one embodiment, the architecture and/or functionality of the various previous figures may be implemented in the context of the central processor 701, the graphics processor 706, an integrated circuit (not shown) that is capable of at least a portion of the capabilities of both the central processor 701 and the graphics processor 706, a chipset (i.e., a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 700 may take the form of a desktop computer, laptop computer, server, workstation, game consoles, embedded system, and/or any other type of logic. Still yet, the system 700 may take the form of various other devices including, but not limited to a personal digital assistant (PDA) device, a mobile phone device, a television, etc.

Further, while not shown, the system 700 may be coupled to a network (e.g., a telecommunications network, local area network (LAN), wireless network, wide area network (WAN) such as the Internet, peer-to-peer network, cable network, or the like) for communication purposes.

In one embodiment, certain signals within bus 702 are implemented as GRS signals, as described above in FIGS. 1A-6C.

While various embodiments have been described above, it should be understood that they have been presented by way of example only, and not limitation. Thus, the breadth and scope of a preferred embodiment should not be limited by any of the above-described exemplary embodiments, hut should be defined only in accordance with the following claims and their equivalents.

What is claimed is:

1. A system, comprising:
   a first processor chip configured to include a first ground-referenced single-ended signaling (GRS) interface circuit comprising:
   a first GRS driver circuit, configured to:
      pre-charge a first capacitor to store a first charge during a first pre-charge phase; and
      drive an output signal relative to a ground network based on the first charge during a first drive phase;
   a system function chip configured to include a second GRS interface circuit, comprising a second GRS driver circuit configured to:
      pre-charge a second capacitor to store a second charge during a second pre-charge phase, wherein the second pre-charge phase overlaps in time with the first drive phase; and
      drive the output signal relative to a ground network based on the second charge during a second drive phase, wherein the first pre-charge phase overlaps in time with the second drive phase; and
   a multi-chip module (MCM) package configured to include the first processor chip and the system function chip; and
   a first set of electrical traces fabricated within the MCM package and configured to couple the first GRS interface circuit to the second GRS interface circuit.

2. The system of claim 1, wherein the first GRS interface circuit comprises
   a receiver circuit, configured translate a ground-referenced single-ended input signal to a corresponding logic signal,
   wherein the first set of electrical traces comprise the input signal, the output signal, and the ground network.

3. The system of claim 1, further comprising:
a first memory subsystem included within the MCM package and configured to include a third GRS interface circuit;
a fourth GRS interface circuit included within the first processor chip; and
a second set of electrical traces fabricated within the MCM package and configured to couple the third GRS interface circuit to the fourth GRS interface circuit.

4. The system of claim 3, wherein the first memory subsystem comprises at least two stacked chips.

5. The system of claim 1, further comprising:
a second processor chip included within the MCM package and configured to include a third GRS interface circuit;
a fourth GRS interface circuit included within the first processor chip; and
a second set of electrical traces fabricated within the MCM package and configured to couple the third GRS interface circuit to the fourth GRS interface circuit.

6. The system of claim 5, further comprising:
a first memory subsystem included within the MCM package and configured to include a fifth GRS interface circuit;
a sixth GRS interface circuit included within the second processor chip; and
a third set of electrical traces fabricated within the MCM package and configured to couple the fifth GRS interface circuit to the sixth GRS interface circuit.

7. The system of claim 1, further comprising:
a second processor chip included within the MCM package and configured to include a third GRS interface circuit;
a fourth GRS interface circuit included within the system function chip; and
a second set of electrical traces fabricated within the MCM package and configured to couple the third GRS interface circuit to the fourth GRS interface circuit,
wherein the system function chip is configured to forward data between the first processor chip and the second processor chip.

8. The system of claim 7, further comprising:
a first memory subsystem included within the MCM package and configured to include an fifth GRS interface circuit;
a sixth GRS interface circuit included within the system function chip; and
a third set of electrical traces fabricated within the MCM package and configured to couple the fifth GRS interface circuit and the sixth GRS interface circuit,
wherein the system function chip is configured to forward data between the first memory subsystem and at least the first processor chip or the second processor chip.

9. The system of claim 5, further comprising:
a fifth GRS interface circuit included within the second processor chip;
a sixth GRS interface circuit included within the system function chip; and
a third set of electrical traces fabricated within the MCM package and configured to couple the fifth GRS interface circuit to the sixth GRS interface circuit,
wherein the first processor chip is configured to communicate directly with the second processor chip and with the system function chip, the second processor chip is configured to communicate directly with the first processor chip and with the system function chip, and the system function chip is configured to communicate directly with the first processor chip and with the second processor chip.

10. The system of claim 5, wherein the first processor chip and the second processor chip are manufactured using different fabrication processes.

11. The system of claim 1, wherein the system function chip comprises a coder-decoder (CODEC) circuit.

12. The system of claim 1, wherein the system function chip comprises a signal processor circuit.

13. The system of claim 1, further comprising a modem chip included within the MCM package and configured to communicate with the first processor chip.

14. The system of claim 13, wherein the modem chip communicates with the first processor chip through the system function chip.

15. The system of claim 13, wherein the modem chip implements a wireless local area network modem.

16. The system of claim 13, wherein the first processor chip and the modem chip are manufactured using different fabrication processes.

17. The system of claim 1, further comprising an interface unit chip included within the MCM package and configured to communicate with the first processor chip.

18. The system of claim 1, wherein the MCM package includes an organic substrate or a silicon substrate.

19. A non-transitory computer readable medium, comprising:
code representing a first set of electrical traces configured to couple a first ground-referenced single-ended signaling (GRS) interface circuit of a first processor chip to a second GRS interface circuit of a system function chip within a multi-chip module (MCM) package, the first GRS interface circuit comprising:
a first GRS driver circuit, configured to:
pre-charge a first capacitor to store a first charge during a first pre-charge phase; and
drive an output signal relative to a ground network based on the first charge during a first drive phase; and
the second GRS interface circuit comprising:
a second GRS driver circuit, configured to:
pre-charge a second capacitor to store a second charge during a second pre-charge phase wherein the second pre-charge phase overlaps in time with the first drive phase; and
drive the output signal relative to a ground network based on the second charge during a second drive phase, wherein the first pre-charge phase overlaps in time with the second drive phase; and
code representing a second set of electrical traces configured to couple the first processor chip to a second processor chip within the MCM package;
code representing a third set of electrical traces configured to couple the first processor chip to a first memory subsystem within the MCM package; and
code representing a fourth set of electrical traces configured to couple the second processor chip to a second memory subsystem within the MCM package,
wherein the first set of electrical traces, the second set of electrical traces, the third set of electrical traces, and the fourth set of electrical traces comprise ground-referenced single-ended signal lines.

20. The non-transitory computer readable medium of claim 19, further comprising:
code representing a fifth set of electrical traces configured to couple the system function chip to a modem chip within the MCM package.

21. A method for transmitting data within a multi-chip module (MCM) package, comprising:
- generating an access request within an initiator chip within the MCM package for transmission to a target chip within the MCM package;
- serializing the access request to generate a plurality of individual bits comprising the access request;
- pre-charging a first capacitor based on a first bit comprising the plurality of individual bits during a first pre-charge phase;
- pre-charging a second capacitor based on a second bit comprising the plurality of individual bits during a second pre-charge phase;
- transmitting a first data bit based on a charge associated with the first capacitor during a first drive phase, wherein the second pre-charge phase overlaps in time with the first drive phase;
- transmitting a second data bit based on a charge associated with the second capacitor during a second drive phase, wherein the first pre-charge phase overlaps in time with the second drive phase;
- receiving the first data bit within the target chip; and
- receiving the second data bit within the target chip,
- wherein the first data bit and the second data bit are transmitted from the initiator chip to the target chip through a set of electrical traces fabricated within the MCM package.

22. The method of claim 21, further comprising:
- determining which device is a destination device for the access request based on an address field associated with the access request; and
- forwarding the access request to the destination device.

* * * * *